United States Patent
Hsu et al.

(10) Patent No.: US 10,847,560 B2
(45) Date of Patent: Nov. 24, 2020

(54) BSI IMAGE SENSOR AND METHOD OF FORMING SAME

(71) Applicant: Taiwan Semiconductor Manufacturing Company, Ltd., Hsinchu (TW)

(72) Inventors: Hung-Wen Hsu, Tainan (TW); Jiech-Fun Lu, Madou Township (TW); Yeur-Luen Tu, Taichung (TW); U-Ting Chen, Wanluan Township (TW); Shu-Ting Tsai, Kaohsiung (TW); Hsiu-Yu Cheng, Kaohsiung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/383,949

(22) Filed: Apr. 15, 2019

(65) Prior Publication Data
US 2019/0252423 A1   Aug. 15, 2019

Related U.S. Application Data

(60) Division of application No. 15/905,033, filed on Feb. 26, 2018, now Pat. No. 10,269,843, which is a continuation of application No. 15/079,886, filed on Mar. 24, 2016, now Pat. No. 9,917,121.

(51) Int. Cl.
*H01L 27/14* (2006.01)
*H01L 27/146* (2006.01)

(52) U.S. Cl.
CPC ...... *H01L 27/1462* (2013.01); *H01L 27/1464* (2013.01); *H01L 27/14623* (2013.01); *H01L 27/14685* (2013.01); *H01L 27/14689* (2013.01)

(58) Field of Classification Search
CPC .......... H01L 27/1462; H01L 27/14623; H01L 27/1464; H01L 27/14685; H01L 27/14689
See application file for complete search history.

(56) References Cited

U.S. PATENT DOCUMENTS

| | | | | |
|---|---|---|---|---|
| 7,282,855 | B2 * | 10/2007 | Park | H01L 27/3244 313/500 |
| 8,039,883 | B2 * | 10/2011 | Kohyama | H01L 27/1463 257/292 |
| 8,216,873 | B2 * | 7/2012 | Uya | H01L 27/14603 438/70 |
| 8,907,385 | B2 * | 12/2014 | JangJian | H01L 27/14623 257/290 |

(Continued)

*Primary Examiner* — Mohammed Shamsuzzaman
(74) *Attorney, Agent, or Firm* — Slater Matsil, LLP

(57) ABSTRACT

A backside illumination (BSI) image sensor and a method of forming the same are provided. A method includes forming a plurality of photosensitive pixels in a substrate, the substrate having a first surface and a second surface, the second surface being opposite the first surface, the substrate having one or more active devices on the first surface. A first portion of the second surface is protected. A second portion of the second surface is patterned to form recesses in the substrate. An anti-reflective layer is formed on sidewalls of the recesses. A metal grid is formed over the second portion of the second surface, the anti-reflective layer being interposed between the substrate and the metal grid.

17 Claims, 20 Drawing Sheets

(56) References Cited

U.S. PATENT DOCUMENTS

| | | | | |
|---|---|---|---|---|
| 9,024,369 | B2* | 5/2015 | JangJian | H01L 27/14643 |
| | | | | 257/294 |
| 9,219,092 | B2* | 12/2015 | JangJian | H01L 27/1446 |
| 9,257,476 | B2* | 2/2016 | JangJian | H01L 27/1464 |
| 9,478,581 | B2* | 10/2016 | JangJian | H01L 27/14685 |
| 2008/0290382 | A1* | 11/2008 | Hirota | H01L 27/14627 |
| | | | | 257/291 |
| 2010/0096677 | A1* | 4/2010 | Inoue | H01L 27/1464 |
| | | | | 257/294 |
| 2010/0327391 | A1* | 12/2010 | McCarten | H01L 27/14609 |
| | | | | 257/447 |
| 2011/0019050 | A1* | 1/2011 | Yamashita | H01L 27/1463 |
| | | | | 348/308 |
| 2012/0261781 | A1* | 10/2012 | Hsu | H01L 27/1464 |
| | | | | 257/432 |
| 2013/0032920 | A1* | 2/2013 | Lin | H01L 27/1464 |
| | | | | 257/447 |
| 2013/0241018 | A1* | 9/2013 | JangJian | H01L 27/14621 |
| | | | | 257/432 |
| 2014/0061842 | A1* | 3/2014 | Ting | H01L 27/14623 |
| | | | | 257/448 |
| 2015/0048467 | A1* | 2/2015 | Weng | H01L 27/14687 |
| | | | | 257/432 |
| 2015/0264233 | A1* | 9/2015 | Chien | H01L 27/14685 |
| | | | | 348/374 |
| 2015/0303233 | A1* | 10/2015 | Borthakur | H01L 27/14636 |
| | | | | 348/273 |
| 2015/0311248 | A1* | 10/2015 | Lee | H01L 27/1464 |
| | | | | 257/432 |
| 2015/0333093 | A1* | 11/2015 | Ting | H01L 27/1464 |
| | | | | 257/432 |
| 2016/0276386 | A1* | 9/2016 | Hsu | H01L 27/1462 |
| 2016/0276400 | A1* | 9/2016 | Cheng | H01L 27/14689 |

* cited by examiner

BSI IMAGE SENSOR AND METHOD OF FORMING SAME

PRIORITY CLAIM AND CROSS-REFERENCE

This application is a division of U.S. application Ser. No. 15/905,033, entitled "BSI Image Sensor and Method of Forming Same," filed on Feb. 26, 2018, which is a continuation of U.S. application Ser. No. 15/079,886, entitled "BSI Image Sensor and Method of Forming Same," filed on Mar. 24, 2016, which applications are hereby incorporated herein by reference.

BACKGROUND

Backside illumination (BSI) image sensor chips are replacing front-side illumination sensor chips for their higher efficiency in capturing photons. In the formation of the BSI image sensor chips, image sensors and logic circuits are formed in a semiconductor substrate of a wafer, followed by the formation of an interconnect structure on a front side of the silicon chip.

The image sensors in the BSI image sensor chips generate electrical signals in response to the stimulation of photons. The magnitudes of the electrical signals (such as the photo-current) depend on the intensity of the incident light received by the respective image sensors. The image sensors, however, suffer from non-optically generated signals, which include the leakage signals, thermally generated signals, dark currents, and the like. Accordingly, the electrical signals generated by the image sensors need to be calibrated, so that the undesirable signals are cancelled out from the output signals of the image sensors. To cancel the non-optically generated signals, black reference image sensors are formed, and are used to generate non-optically generated signals. The black reference image sensors, therefore, need to be blocked from receiving light signals.

The black reference image sensors are covered by a metal shield, which is formed on the backside of the semiconductor substrate, in which the image sensors are formed. Furthermore, backside metal pads are also formed on the backside of the semiconductor substrate for bonding or testing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
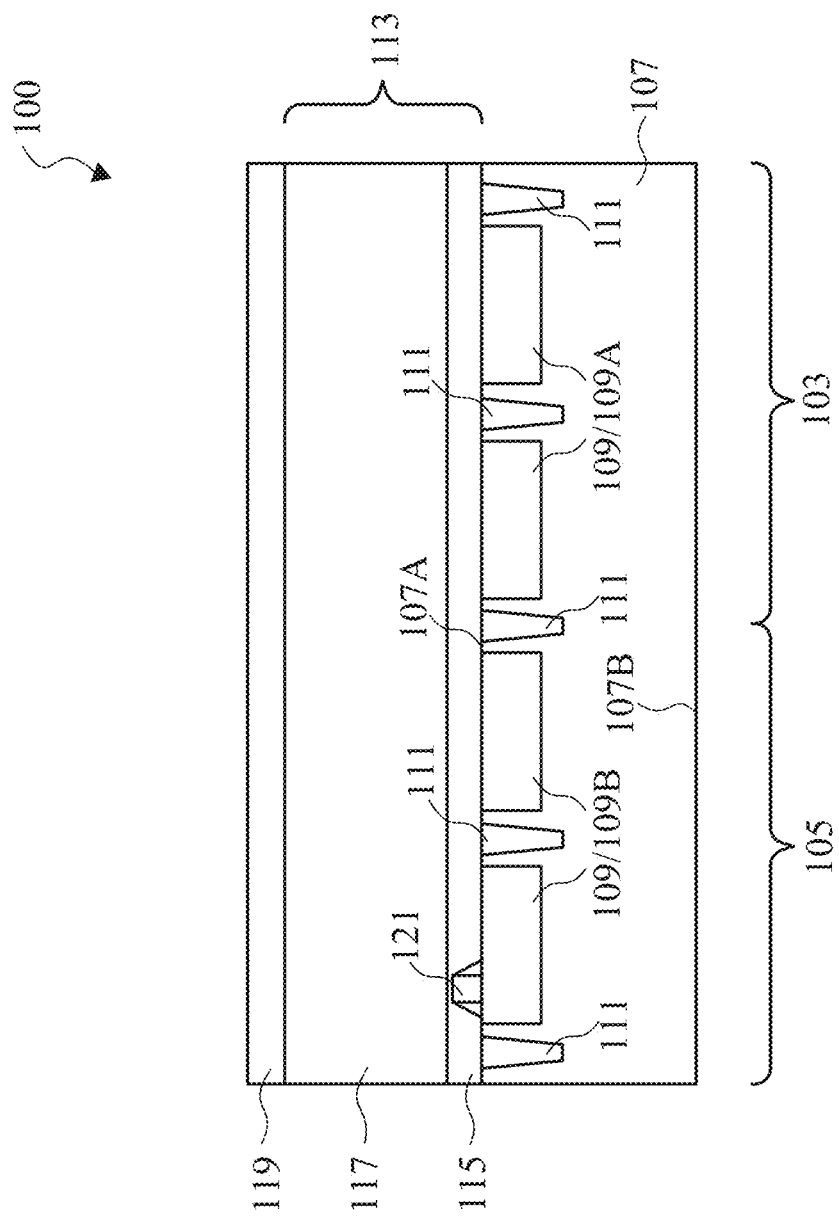
FIGS. 1-8 are cross-sectional views of various processing steps during fabrication of a BSI image sensor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A backside illumination (BSI) image sensor and a method of forming the same are provided in accordance with various exemplary embodiments. Various embodiments include a high absorption (HA) structure on a backside of a BSI sensor to reduce reflectance and to improve absorption of incident electromagnetic radiation. Various embodiments further optimize process steps performed on a backside of a BSI image sensor to improve the optical performance of the resulting BSI image sensor. For example, various embodiments described herein reduce the optical path of the resulting BSI image sensor, which advantageous improves the quantum efficiency and reduces the optical cross-talk of the resulting BSI image sensor.

FIGS. 1-8 are cross-sectional views of various processing steps during fabrication of a BSI image sensor 100 in accordance with some embodiments. FIG. 1 illustrates an intermediate structure of the BSI image sensor 100 in accordance with some embodiments. In some embodiments, the BSI image sensor 100, which may be a part of an un-singulated wafer that comprises additional BSI image sensors similar to the BSI image sensor 100. In the illustrated embodiments, a portion of the BSI image sensor 100 having a pixel array region 103 and a black level correction (BLC) region 105 is illustrated. The BSI image sensor 100 may further include other regions such as, for example, a contact pad (E-pad) region and an alignment region such as a scribe-line primary mark (SPM) region, which are not explicitly illustrated, since their inclusion is not necessary for understanding various embodiments described herein.

In some embodiments, the BSI image sensor 100 includes a substrate 107. The substrate 107 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 107 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Throughout the description, a surface 107A is referred to as a front surface of the substrate 107, and a surface 107B is referred to as a back surface of the substrate 107, which coincides with a back surface of the BSI image sensor 100.

A plurality of photosensitive pixels 109 (including 109A and 109B) are formed at the front surface 107A of the substrate 107. The photosensitive pixels 109 include respective photosensitive devices (not illustrated), which may be formed, for example, by implanting suitable impurity ions. In some embodiments, the impurity ions may be implanted in an epitaxial layer (not illustrated) within the substrate 107. The photosensitive devices are configured to covert light signals (e.g., photons) to electrical signals, and may be PN junction photo-diodes, PNP photo-transistors, NPN photo-transistors, or the like. For example, the photosensitive devices may include an n-type implantation region formed within a p-type semiconductor layer (e.g., at least a portion of the substrate 107). In such embodiments, the p-type substrate may isolate and reduce electrical cross-talk between adjacent photo-active regions of the photosensitive pixels 109. In an embodiment, the photosensitive pixels 109 extend from the front surface 107A of the substrate 107 towards the back surface 107B of the substrate 107 and form a photosensitive pixel array. In some embodiments, the photosensitive pixels 109 form a two-dimensional rectangular array as viewed from top (not illustrated). In some embodiments, each photosensitive pixel 109 may further include a transfer gate transistor (not illustrated) and a floating diffusion capacitor (not illustrated). In each photosensitive pixel 109, a first source/drain region the corresponding transfer gate transistor is electrically coupled to a respective photosensitive device, a second source/drain region the corresponding transfer gate transistor is electrically coupled to a respective floating diffusion capacitor.

In some embodiments, isolation regions 111 are formed in the substrate 107 between neighboring photosensitive pixels 109 to prevent electrical cross-talk between the photosensitive pixels 109. In some embodiments, the isolation regions 111 may include shallow trench isolation (STI) structures. In some embodiments, the STI structures may be formed by patterning the front surface 107A of the substrate 107 to form trenches in the substrate 107 and filling the trenches with suitable dielectric materials to form the STI structures. In some embodiments, the substrate 107 is patterned using suitable photolithography and etching process. In other embodiments, the isolation regions 111 may include various doping regions formed using suitable implantation processes.

In some embodiments, the pixel array region 103 of the BSI image sensor 100 includes active photosensitive pixels 109A, which are used for generating electrical signals from the sensed light. The BLC region 105 of the BSI image sensor 100 includes reference photosensitive pixels 109B, which are used for generating reference black level signals. In some embodiments the photosensitive pixels 109A and 109B may be formed using similar methods, and structures of the photosensitive pixels 109A and 109B may be identical to each other.

In some embodiments, one or more active and/or passive devices 121 (depicted as a single transistor in FIG. 1 for illustrative purposes) are formed on the front surface 107A of the substrate 107 in addition to the photosensitive pixels 109 comprising the photodiode devices, the transfer gate transistors, and the floating diffusion capacitors. The one or more active and/or passive devices 121 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for illustrative purposes only and are not meant to limit the present invention in any manner. Other circuitry may be used as appropriate for a given application.

An interconnect structure 113 may be formed on the front surface 107A of the substrate 107. Interconnect structure 113 may include an inter-layer dielectric (ILD) layer 115 and/or inter-metal dielectric (IMD) layers 117 containing conductive features (e.g., conductive lines and vias comprising copper, aluminum, tungsten, combinations thereof, and the like) formed using any suitable method, such as damascene, dual damascene, or the like. The ILD 115 and IMDs 117 may include low-k dielectric materials having k values, for example, lower than about 4.0 or even 2.0 disposed between such conductive features. In some embodiments, the ILD 115 and IMDs 117 may be made of, for example, phosphosilicate glass (PSG), borophosphosilicate glass (BPSG), fluorosilicate glass (FS G), SiOxCy, Spin-On-Glass, Spin-On-Polymers, silicon carbon material, compounds thereof, composites thereof, combinations thereof, or the like, formed by any suitable method, such as spinning, chemical vapor deposition (CVD), plasma-enhanced CVD (PECVD), or the like. The interconnect structure electrically connects various active and/or passive devices (e.g., the photosensitive devices of the photosensitive pixels 109) to form electrical circuits within the BSI image sensor 100. In some embodiments, a passivation layer 119 is formed over the interconnect structure 113. The passivation layer 119 may be formed of a non-low-k dielectric material having a k value greater than 3.9. In some embodiments, the passivation layer 119 may include one or more layers of silicon oxide, silicon nitride layer, or the like, and may formed using CVD, PECVD, thermal oxidation, or the like.

Figure 2:
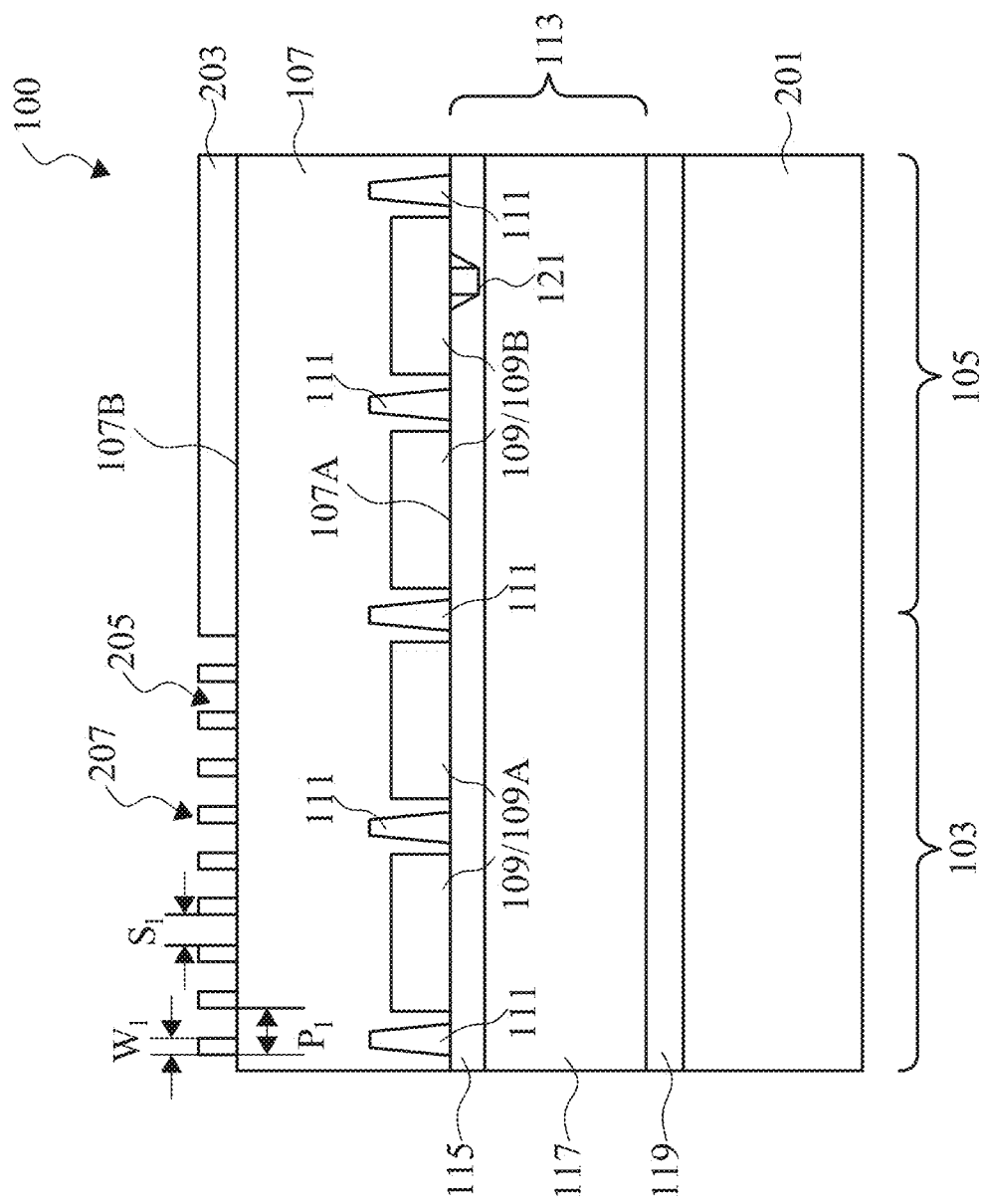
Figure 3:
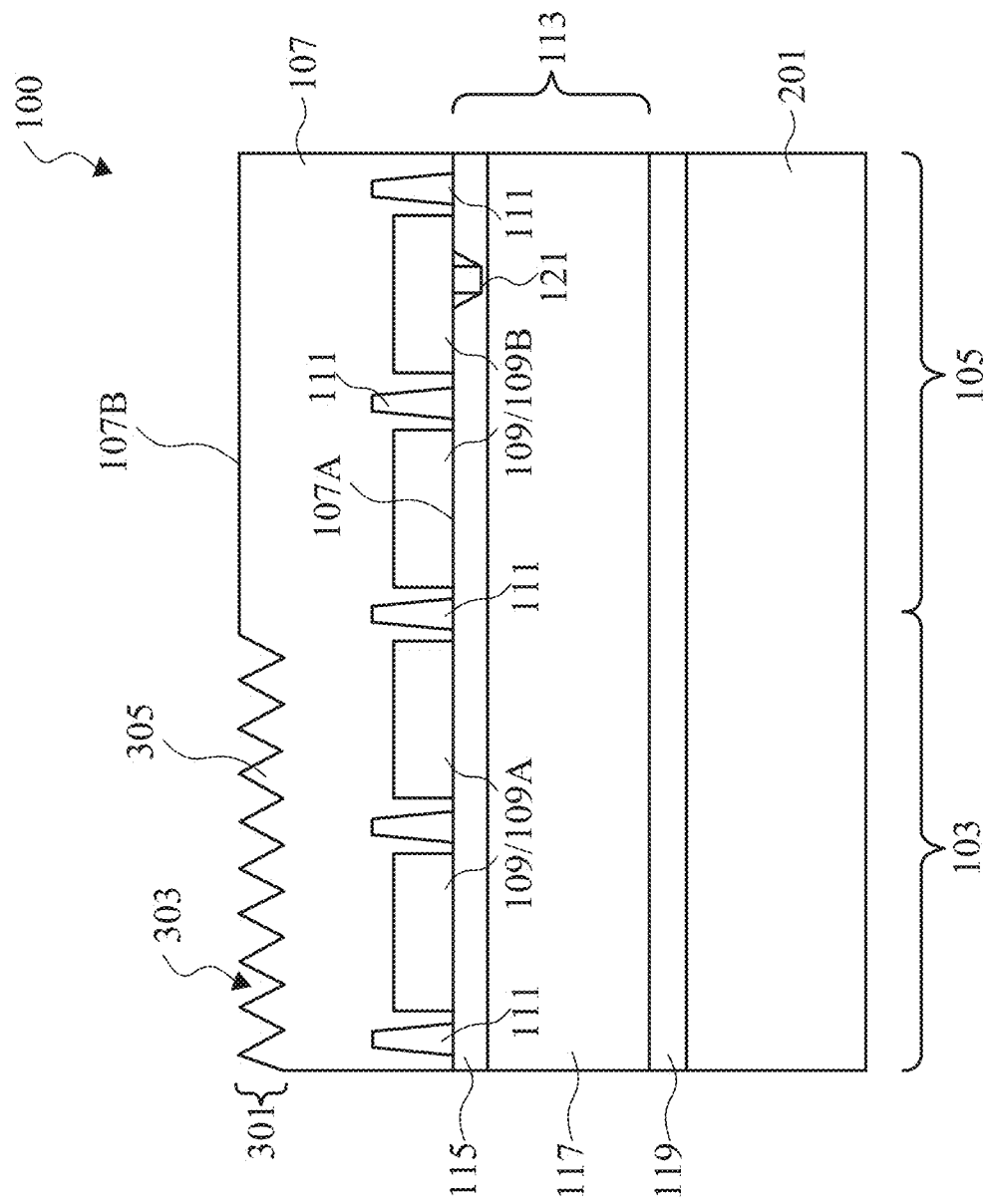

FIGS. 2 and 3 illustrate formation of a high absorption (HA) structure 301 on the back surface 107B of the BSI image sensor 100 in the pixel array region 103. As described below in greater detail, the HA structure 301 reduces reflectance of the back surface 107B of the BSI image sensor 100. Thus, more light is absorbed by the active photosensitive pixels 109A. Referring first to FIG. 2, the BSI image sensor 100 is flipped and bonded to a carrier substrate 201 such that the front surface 107A of the substrate 107 faces the carrier substrate 201 and the back surface 107B of the substrate 107 is exposed for further processing. Various bonding techniques may be employed to achieve bonding between the BSI image sensor 100 and the carrier substrate 201. In some embodiments, the bonding techniques may include for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding, adhesive bonding, anodic bonding, any combinations thereof and/or the like. In some embodiments, the carrier substrate 201 may provide mechanical support for processing steps performed on the back surface 107B of the substrate 107. In some embodiments, the carrier substrate 201 may be formed of silicon or glass and may be free from electrical circuitry formed thereon. In such embodiments, the carrier substrate 201 provides temporary support and is de-bonded from the BSI image sensor 100 after completing the process steps performed on the back surface 107B of the substrate 107. In other embodiments, the carrier substrate 201 may comprise a semiconductor substrate (not illustrated), one or more active devices (not illustrated) on the semiconductor substrate, and an interconnect structure (not illustrated) over the one or more active devices. In such embodiments, in addition to providing the mechanical support, the carrier substrate 201 may provide additional electrical functionality to the BSI image sensor 100 depending on design requirements.

After the BSI image sensor 100 and the carrier substrate 201 are bonded, a thinning process may be applied to the back surface 107B of the BSI image sensor 100. In an embodiment, the thinning process serves to allow more light to pass through from the back surface 107B of substrate 107 to photo-active region of the photosensitive pixels 109 without being absorbed by the substrate 107. In an embodiment in which the photosensitive pixels 109 are fabricated in an epitaxial layer, the back surface 107B of the BSI image sensor 100 may be thinned until the epitaxial layer is exposed. The thinning process may be implemented by using suitable techniques such as grinding, polishing, a SMARTCUT® procedure, an ELTRAN® procedure, and/or chemical etching. After thinning, the substrate 107 may have a thickness of about 2.5 μm, for example, although other embodiments may include the substrate 107 having a different thickness after thinning.

Referring further to FIG. 2, a patterned mask 203 is formed on the back surface 107B of the BSI image sensor 100. In some embodiments, the patterned mask 203 may formed of a photosensitive material such as photoresist or a non-photosensitive material such as silicon oxide, silicon nitride, silicon oxinitride, the like, or a combination thereof. In some embodiments in which the patterned mask 203 is formed of a photosensitive material, the patterned mask 203 is patterned by exposing the photosensitive material to light. Subsequently, the photosensitive material is cured and developed to remove exposed (or unexposed) portions of the photosensitive material. In other embodiments in which the patterned mask 203 is formed of a non-photosensitive material, the non-photosensitive material may be patterned using suitable photolithography and etching processes.

The patterned mask 203 is patterned to form a plurality of openings 205 therein, such that portions of the back surface 107B of the BSI image sensor 100 in the pixel array region 103 are exposed through the openings 205, while the back surface 107B of the BSI image sensor 100 in the BLC region 105 is completely covered by the patterned mask 203. In some embodiments, unremoved portions 207 of the patterned mask 203 that are interposed between neighboring openings 205 have a uniform width $W_1$, a uniform spacing $S_1$, and a uniform pitch $P_1$, with $P_1$ being equal to a sum of $W_1$ and $S_1$. In some embodiments, the unremoved portions 207 of the patterned mask 203 may form a two-dimensional rectangular array or a tow-dimensional grid as viewed from top. Subsequently, the back surface 107B of the BSI image sensor 100 is patterned using a suitable etching process while using the patterned mask 203 as an etch mask. As described below in greater detail, a pattern of the HA structure 301 may be tuned by tuning the width $W_1$, the spacing $S_1$, and the pitch $P_1$ of the unremoved portions 207 of the patterned mask 203. In some embodiments, the width $W_1$ is between about 0.08 μm and about 0.3 μm, the spacing $S_1$ is between about 0.72 μm and about 2.7 μm, and the pitch $P_1$ is between about 0.8 μm and about 3 μm.

Referring to FIG. 3, the back surface 107B of the BSI image sensor 100 is patterned to form the HA structure 301 on the back surface 107B of the BSI image sensor 100. In some embodiments, the back surface 107B of the BSI image sensor 100 is patterned using a suitable anisotropic wet etching process, while using the patterned mask 203 as an etch mask. In some embodiments in which the substrate 107 is formed of silicon, the anisotropic wet etch may be performed using potassium hydroxide (KOH), ethylenediamine pyrocatechol (EDP), tetramethylammonium hydroxide (TMAH), or similar. After forming the HA structure 301, the patterned mask 203 is removed. In some embodiments in which the patterned mask 203 is formed of a photoresist, the patterned mask 203 may be removed using an ashing processes followed by a wet clean process. In other embodiments in which the patterned mask 203 is formed of a non-photosensitive material, the patterned mask 203 may be removed using a suitable etching process.

The back surface 107B of the BSI image sensor 100 is patterned to form a plurality of trenches 303 in the substrate 107. In some embodiments, the trenches 303 may have a depth between about 0.25 μm and about 1 μm. In the illustrated embodiment, unremoved portions 305 of the substrate 107 that are interposed between the neighboring trenches 303 have a zig-zag-like pattern or a saw-tooth-like pattern. In some embodiments, the trenches 303 may form a continuous trench surrounding the unremoved portions 305 of the HA structure 301 as viewed from top, where the unremoved portions 305 of the HA structure 301 have conical shapes arranged in a rectangular array. The pattern of the HA structure 301 as illustrated in FIG. 3 is provided for illustrative purposes only and are not meant to limit the present invention in any manner. As described below in greater detail, the pattern of the HA structure 301 may be altered by changing the width $W_1$, the spacing $S_1$, and the pitch $P_1$ of the unremoved portions 207 of the patterned mask 203, and by changing parameters of the etching process such as, for example, a duration of the etching process. Such patterns of various HA structures are illustrated in FIGS. 9A-13B and are discussed in greater detail below.

FIG. 3 shows that there are about three unremoved portions 305 of the HA structure 301 per active photosensitive pixel 109A in the illustrated cross section. However, in other embodiments, the number of unremoved portions 305 of the HA structure 301 per active photosensitive pixel 109A may be greater than three or less than three, and may vary according to design requirements for the BSI image sensor 100. Furthermore, in the illustrated embodiment, top surfaces of unremoved portions 305 of the HA structure 301 have sharp corners. However, in other embodiments, the unremoved portions 305 of the HA structure 301 may have rounded or flat top surfaces as discussed in greater detail below with reference to FIGS. 9A-13B.

Figure 4:
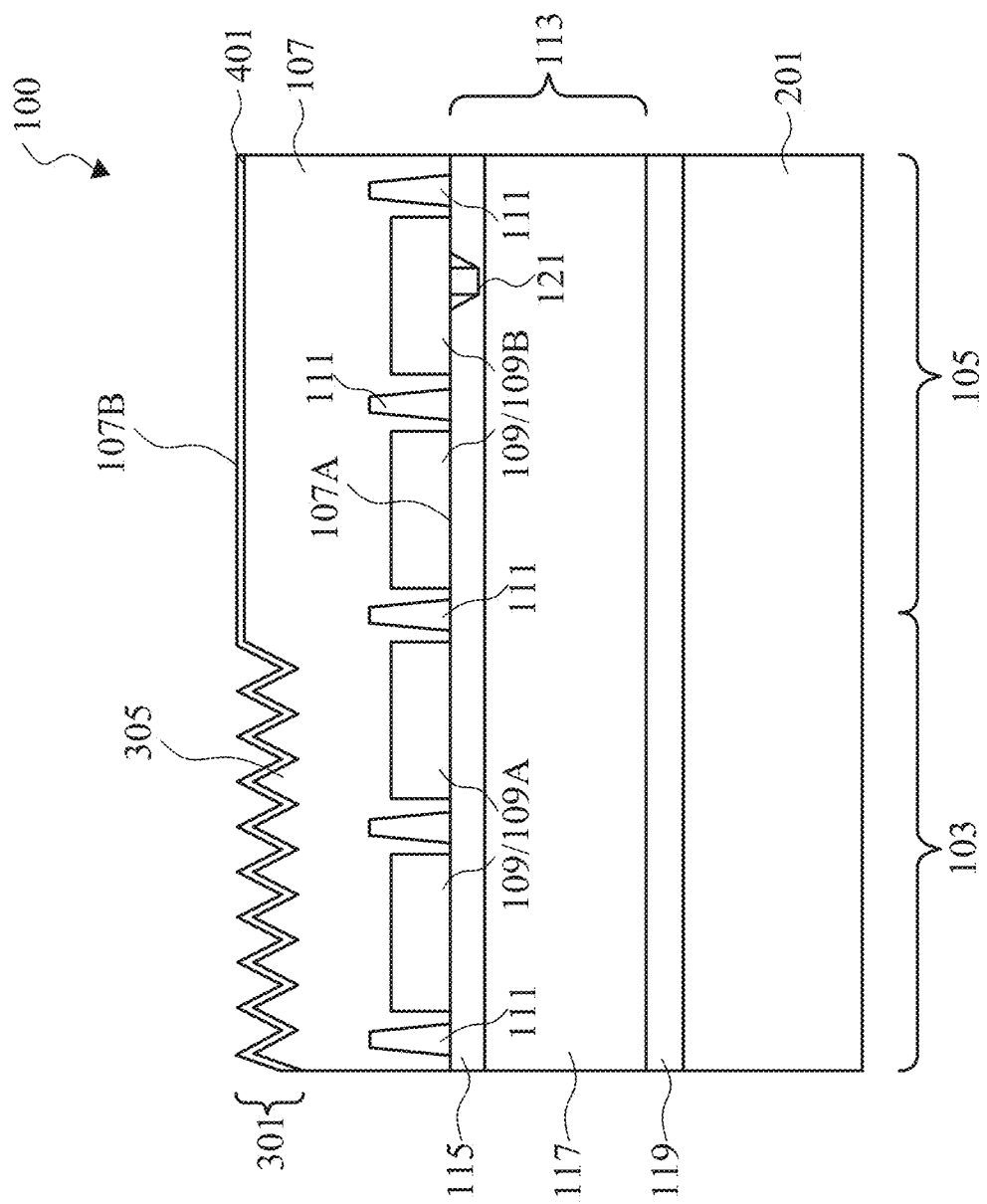

Referring to FIG. 4, after forming the HA structure 301, a bottom anti-reflective coating (BARC) layer 401 is formed on the back surface 107B of the BSI image sensor 100. In some embodiments, the BARC layer 401 comprises suitable dielectric materials such as silicon oxide, silicon nitride, silicon oxynitride, hafnium oxide, tantalum oxide, or a combination thereof, although other materials may be used. In some embodiments, the BARC layer 401 may formed using atomic layer deposition (ALD), CVD, PECVD, physical vapor deposition (PVD), metal-organic chemical vapor deposition (MOCVD), or the like. In some embodiments in which the BARC layer 401 comprises an oxide layer, a low-temperature remote plasma-assisted oxidation (LRPO) process may be used to form the BARC layer 401. The BARC layer 401 is used to further reduce a reflection of incident light from the back surface 107B of the BSI image sensor 100. In the illustrated embodiment, the BARC layer 401 comprises a $HfO_2$ layer having a thickness between about 20 Å and about 150 Å, such as about 60 Å, and a $Ta_2O_5$ layer having a thickness between about 350 Å and about 800 Å, such as about 520 Å, where $Ta_2O_5$ layer is formed over the $HfO_2$ layer.

Figure 5:
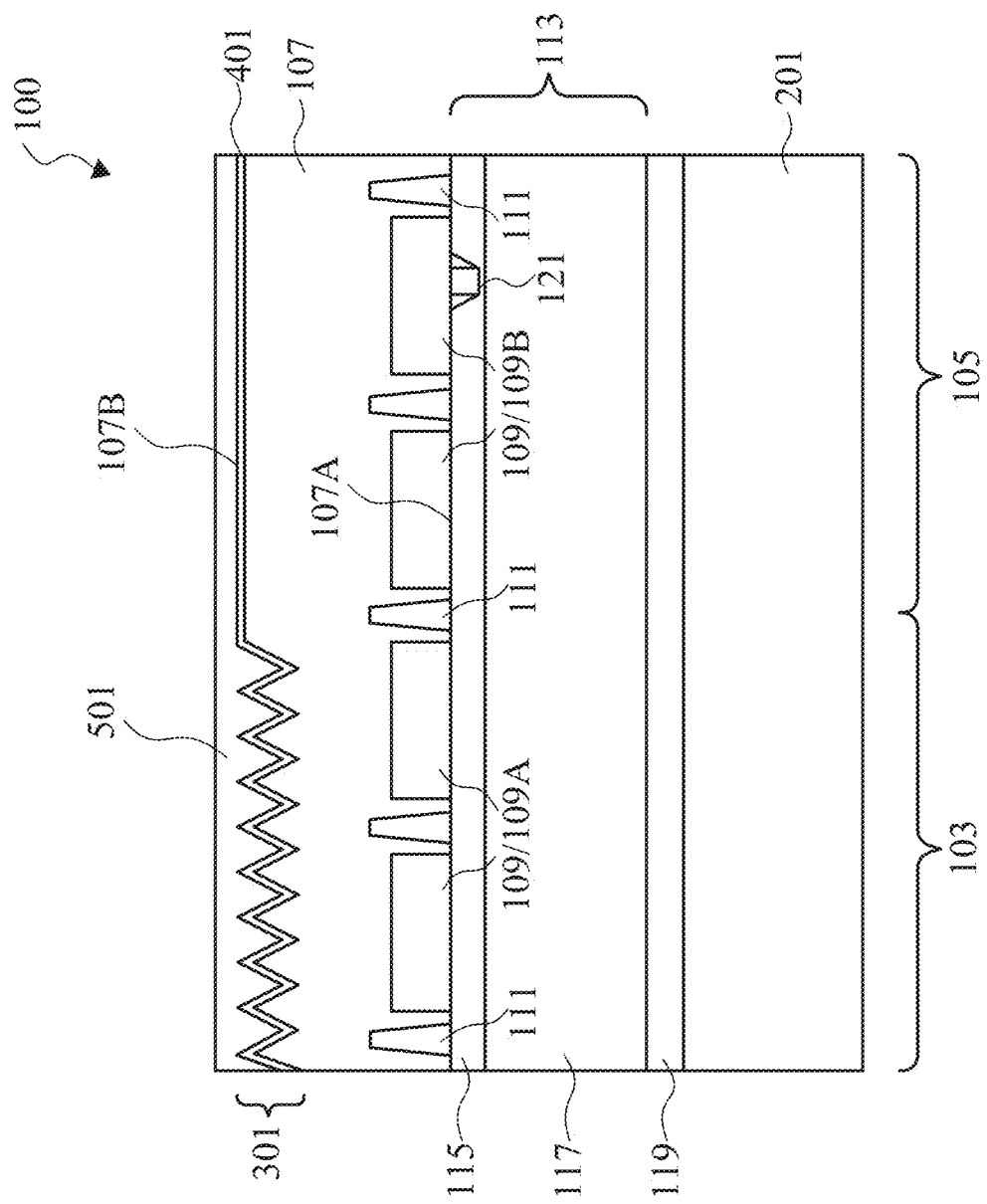

Referring to FIG. 5, a first dielectric layer 501 is formed over the BARC layer 401. In some embodiments, the first dielectric layer 501 may be formed of silicon oxide, for example, although other dielectric materials may be used. In some embodiments, the first dielectric layer 501 may be formed using ALD, CVD, PECVD, the like, or a combination thereof. In some embodiments in which the first dielectric layer 501 comprises an oxide layer, LRPO may be used to form the first dielectric layer 501. In the illustrated embodiment, the first dielectric layer 501 is a plasma enhanced oxide (PEOX) layer. Subsequently, the first dielectric layer 501 is planarized using a grinding process, a chemical mechanical polishing (CMP) process, an etching process, or the like. After the planarization process, the first dielectric layer 501 may have a thickness between about 250 Å and about 2500 Å, such as about 1300 Å. The first dielectric layer 501 may be also referred to as a first buffer oxide layer 501.

Figure 6:
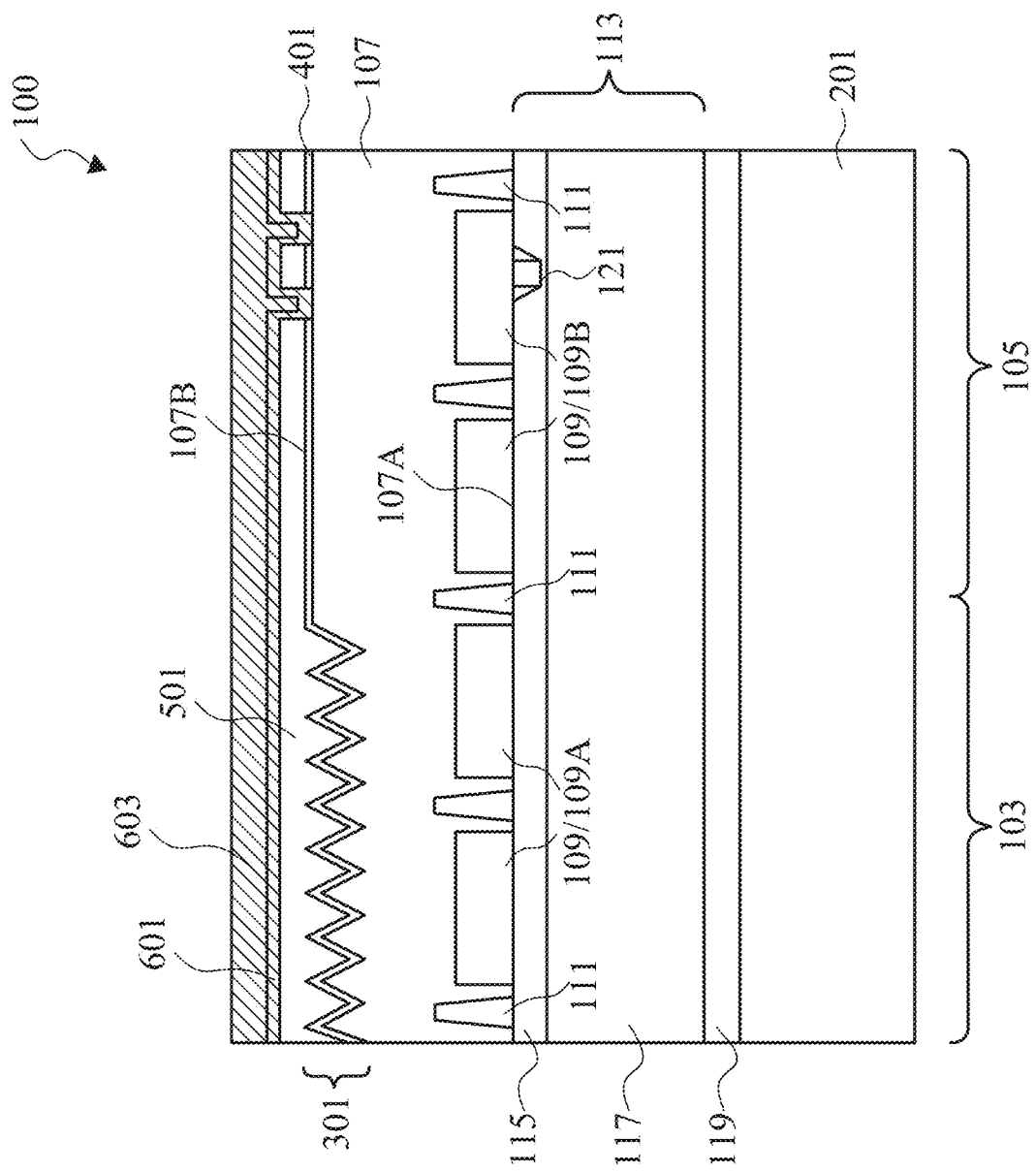
Figure 7:
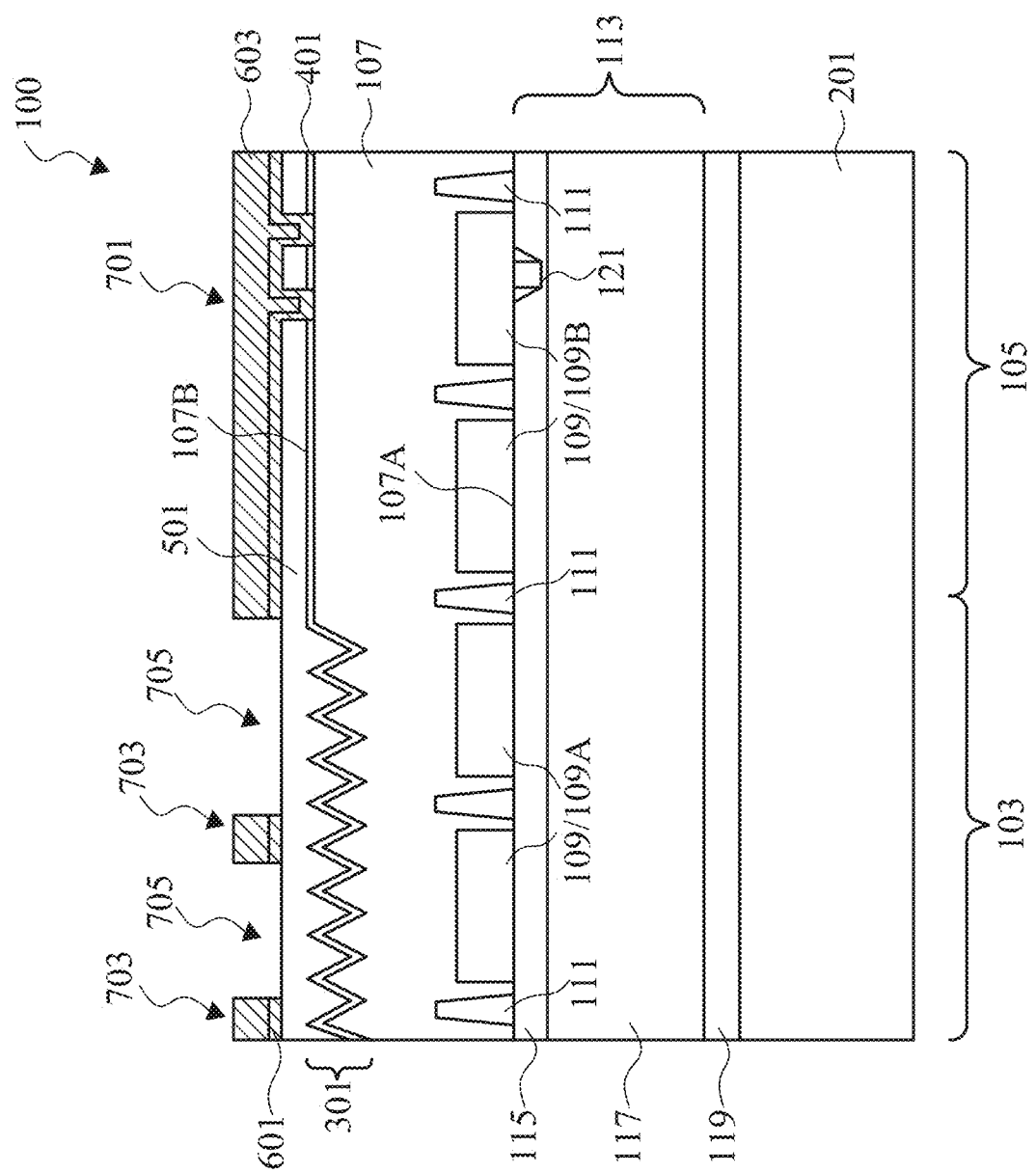

Referring to FIGS. 6 and 7, a metal shield 701 and a metal grid 703 is formed over the first dielectric layer 501 such that the metal shield 701 is formed in the BLC region 105 of the BSI image sensor 100 and the metal grid 703 is formed in the pixel array region 103 of the BSI image sensor 100. Referring first to FIG. 6, a barrier/adhesion layer 601 is formed over the first dielectric layer 501 and a conductive layer 603 is formed over the barrier/adhesion layer 601. In some embodiments, the barrier/adhesion layer 601 may comprise titanium, titanium nitride, tantalum, tantalum nitride, or multilayers thereof and may be formed using CVD, PVD, MOCVD, or the like. A conductive layer 603 may comprise aluminum, copper, nickel, tungsten, alloys thereof, or the like and may be formed using PDV, plating, or the like. In some embodiments, a thickness of the barrier/adhesion layer 601 may be between about 50 Å and about 500 Å, and a thickness of the conductive layer 603 may be between about 500 Å and about 3500 Å. In the illustrated embodiment, the barrier/adhesion layer 601 comprises titanium nitride having a thickness of about 300 Å and the conductive layer 603 comprises tungsten having a thickness of about 2000 Å. It is appreciated that the dimensions recited throughout the description are merely examples, and may be changed to different values.

In some embodiments, the barrier/adhesion layer 601 and the conductive layer 603 are formed such that the barrier/adhesion layer 601 and the conductive layer 603 are electrically coupled to the substrate 107. Such electrical coupling provides proper grounding to the barrier/adhesion layer 601 and the conductive layer 603, and to the metal shield 701 and the metal grid 703 that are subsequently formed by patterning the barrier/adhesion layer 601 and the conductive layer 603. In such embodiments, the BARC layer 401 and the first dielectric layer 501 are patterned to form one or more openings that expose the back surface 107B of the substrate 107 in the BLC region 105. In some embodiments, the BARC layer 401 and the first dielectric layer 501 may be patterned using suitable photolithography and etching processes. The barrier/adhesion layer 601 and the conductive layer 603 fill the one or more openings and are electrically coupled to the substrate 107.

Referring to FIG. 7, the barrier/adhesion layer 601 and the conductive layer 603 are patterned to form the metal shield 701 and the metal grid 703. The patterning process forms a plurality of openings 705 in the barrier/adhesion layer 601 and the conductive layer 603 in the pixel array region 103 such that the first dielectric layer 501 is exposed through the openings 705. In some embodiments, the active photosensitive pixels 109A are aligned to respective openings 705. A portion of the barrier/adhesion layer 601 and the conductive layer 603 remaining in the BLC region 105 is used as the metal shield 701. The metal shield 701 blocks the light that otherwise would be received by the reference photosensitive pixels 109B. Portions of the barrier/adhesion layer 601 and the conductive layer 603 remaining in the pixel array region 103 form the metal grid 703. The metal grid 703 prevents optical cross-talk between neighboring active photosensitive pixels 109A. In some embodiments, walls of the metal grid 703 may encircle each active photosensitive pixel 109A as viewed from top. Furthermore, the metal grid 703 and the metal shield 701 may be electrically coupled to each other.

Figure 8:
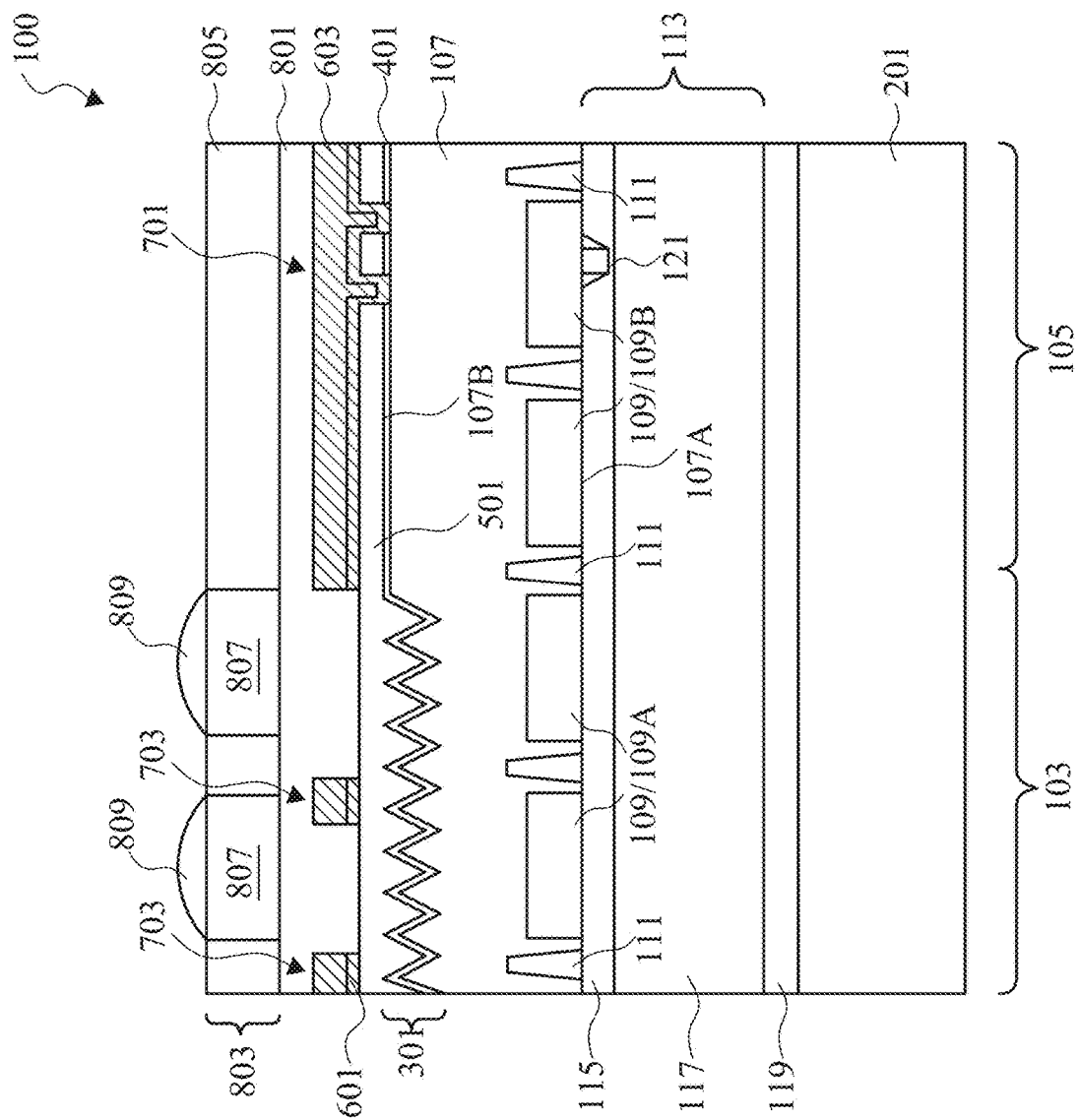

Referring to FIG. 8, a second dielectric layer 801 is formed over the metal grid 703 and the metal shield 701 and fills the openings 705. In some embodiments, the second dielectric layer 801 may be formed using similar materials and methods as the first dielectric layer 501 described above with reference to FIG. 5 and the description is not repeated herein. In some embodiments, the first dielectric layer 501 and the second dielectric layer 801 may be formed of a same material. In other embodiments, the first dielectric layer 501 and the second dielectric layer 801 may be formed of different materials. Subsequently, the second dielectric layer 801 is planarized using a grinding process, a chemical mechanical polishing (CMP) process, an etching process, or the like. After the planarization process, the second dielectric layer 801 may have a thickness between about 2000 Å and about 5000 Å, such as about 3400 Å. The second dielectric layer 801 may be also referred to as a second buffer oxide layer 801.

Referring further to FIG. 8, a color filter layer 803 is formed over the second dielectric layer 801. In some embodiments, the color filter layer 803 comprises a third dielectric layer 805, for example, a silicon oxide layer with a plurality of color filters 807 formed therein. In some embodiments, the color filters 807 are aligned with respective active photosensitive pixels 109A. The color filters 807 may be used to allow specific wavelengths of light to pass while reflecting other wavelengths, thereby allowing the BSI image sensor 100 to determine the color of the light being received by the active photosensitive pixels 109A. The color filters 807 may vary, such as being a red, green, and blue filter as used in a Bayer pattern. Other combinations, such as cyan, yellow, and magenta, may also be used. The number of different colors of the color filters 807 may also vary. The color filters 807 may comprise a polymeric material or resin, such as polymethyl-methacrylate (PMMA), polyglycidyl-methacrylate (PGMA), or the like, that includes colored pigments. In some embodiments, reflective guide layers (not shown) are formed along sidewalls of the color filters 807. The reflective guide layers are formed of a metal or other high refractive index material that is capable of reflecting light, such as copper, aluminum, tantalum nitride, titanium nitride, tungsten, silicon nitride, the like, or a combination thereof.

An array of microlenses 809 is formed over the color filter layer 803. In some embodiments, the microlenses 809 are aligned with respective color filters 807 and respective active photosensitive pixels 109A. The microlenses 809 may be formed of any material that may be patterned and formed into lenses, such as a high transmittance acrylic polymer. In an embodiment, a microlens layer may be formed using a material in a liquid state by, for example, spin-on techniques. Other methods, such as CVD, PVD, or the like, may also be used. The planar material for the microlens layer may be patterned using suitable photolithography and etching methods to pattern the planar material in an array corresponding to the array of the active photosensitive devices. The planar material may then be reflowed to form an appropriate curved surface for the microlenses 809. Subsequently, the microlenses 809 may be cured using, for example, a UV treatment. In some embodiments, after forming the microlenses 809, the carrier substrate 201 may be de-bonded form the BSI image sensor 100 and the BSI image sensor 100 may undergo further processing such as, for example, packaging.

Figure 9A:
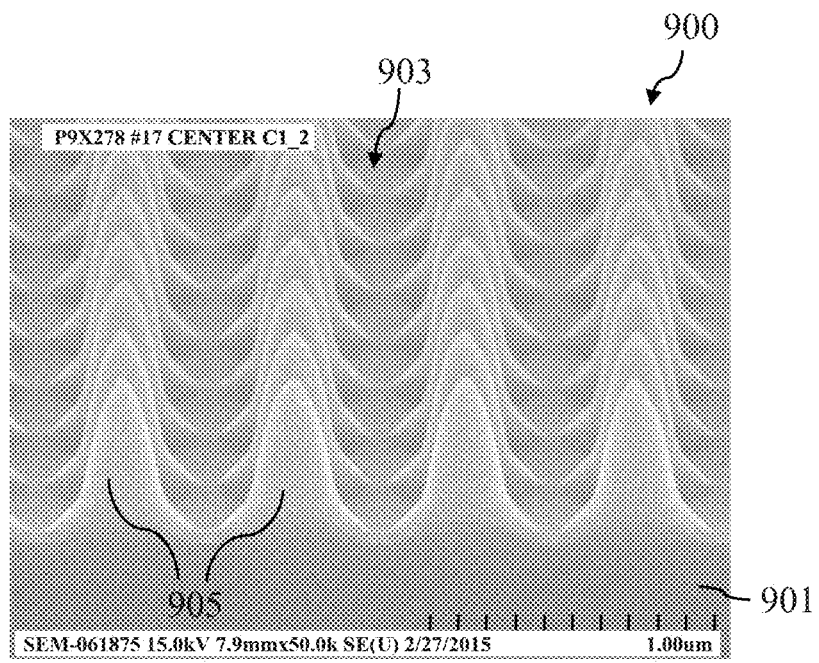
FIGS. 9A-13B are scanning electron microscope (SEM) images illustrating perspective and cross-sectional views of high absorption structures in accordance with some embodiments.
Figure 9B:
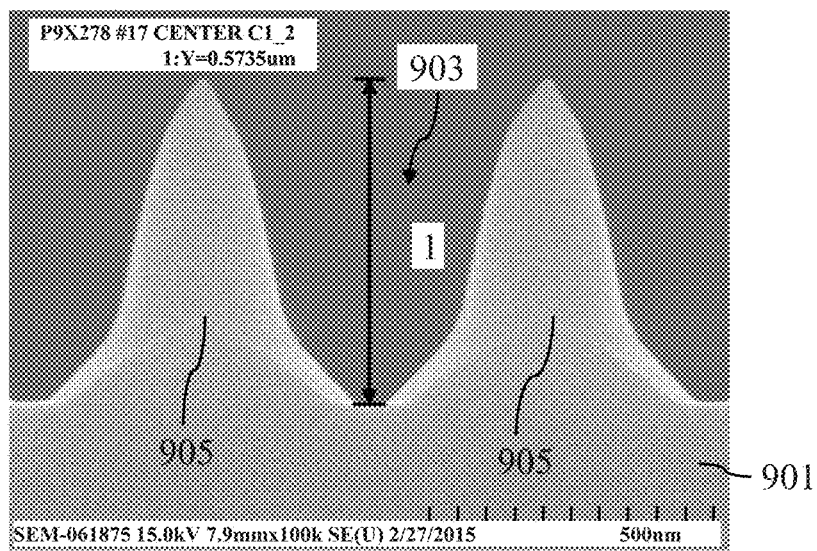

FIGS. 9A and 9B are scanning electron microscope (SEM) images illustrating a perspective and a cross-sectional views, respectively, of a HA structure 900 formed on a back surface of a substrate 901 in accordance with some embodiments. The HA structure 900 may be formed using similar methods as the HA structure 301 described above with reference to FIGS. 2 and 3 and description is not repeated herein. In the illustrated embodiment, the substrate 901 formed of silicon is patterned using a wet etch with TMAH for a duration of about 60 s to form a plurality of trenches 903. In the illustrated embodiment, the trenches 903 have a height of about 5735 Å. The unremoved features 905 of the HA structure 900 that have a conical shape are arranged in a rectangular array, such that the trenches 903 form a continuous trench surrounding each of the unremoved features 905 of the HA structure 900. The patterned mask (not illustrated) similar to the patterned mask 203 illustrated in FIG. 2 is used to aid in patterning the substrate 901. In the illustrated embodiments, unremoved features of the patterned mask (similar to the unremoved portions 207 of the patterned mask 203) have a width of about 0.1 µm, a spacing of about 0.4 µm, and a pitch of about 0.5 µm.

Figure 10A:
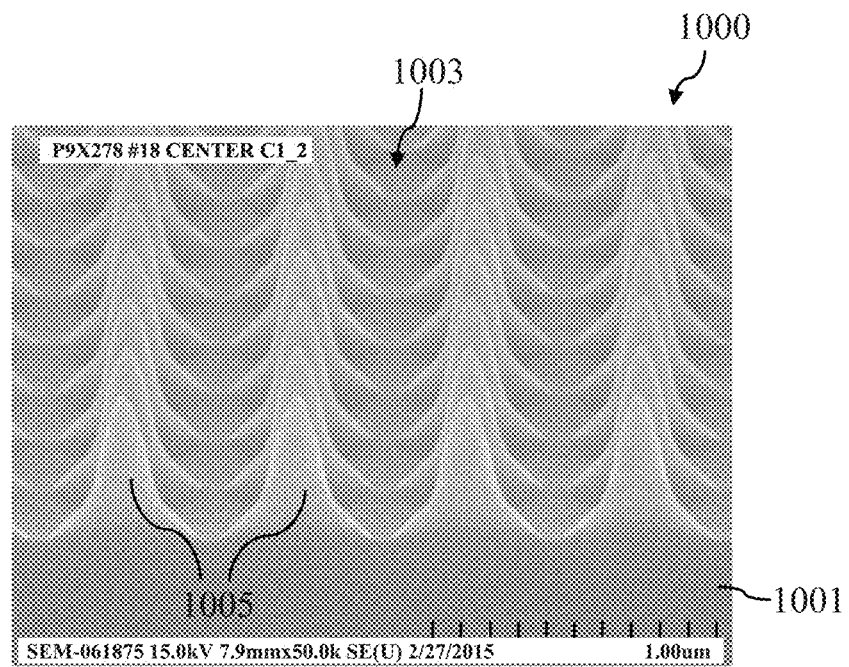
Figure 10B:
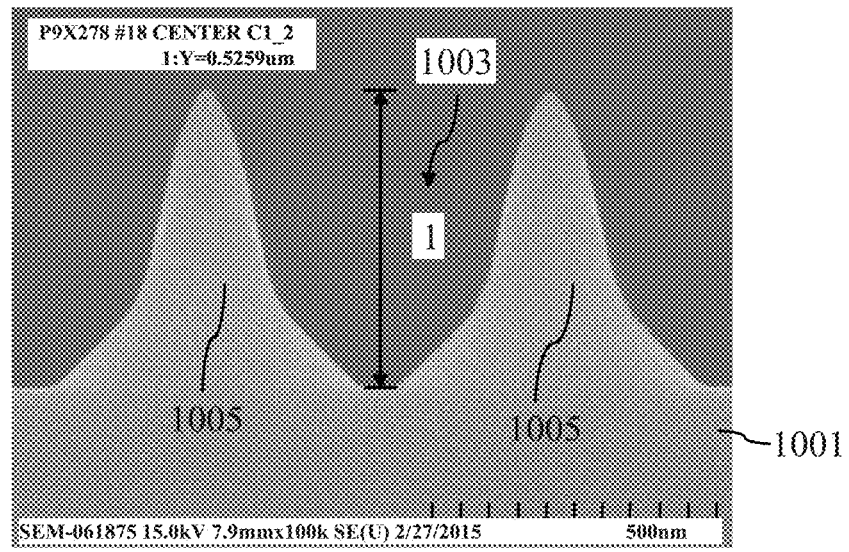

FIGS. 10A and 10B are scanning electron microscope (SEM) images illustrating a perspective and a cross-sectional views, respectively, of a HA structure 1000 formed on a back surface of a substrate 1001 in accordance with some embodiments. The HA structure 1000 may be formed using similar methods as the HA structure 301 described above with reference to FIGS. 2 and 3 and description is not repeated herein. In the illustrated embodiment, the back surface of the substrate 1001 that is formed of silicon is patterned using a wet etch with TMAH for a duration of about 90 s to form a plurality of trenches 1003. In the illustrated embodiment, the trenches 1003 have a height of about 5259 Å. The unremoved features 1005 of the HA structure 1000 that have a conical shape are arranged in a rectangular array, such that plurality of trenches 1003 form a continuous trench surrounding each of the unremoved features 1005 of the HA structure 1000. The patterned mask (not illustrated) similar to the patterned mask 203 illustrated in FIG. 2 is used to aid in patterning the substrate 1001. In the illustrated embodiments, unremoved features of the patterned mask (similar to the unremoved portions 207 of the patterned mask 203) have a width of about 0.1 µm, a spacing of about 0.55 µm, and a pitch of about 0.65 µm.

Figure 11A:
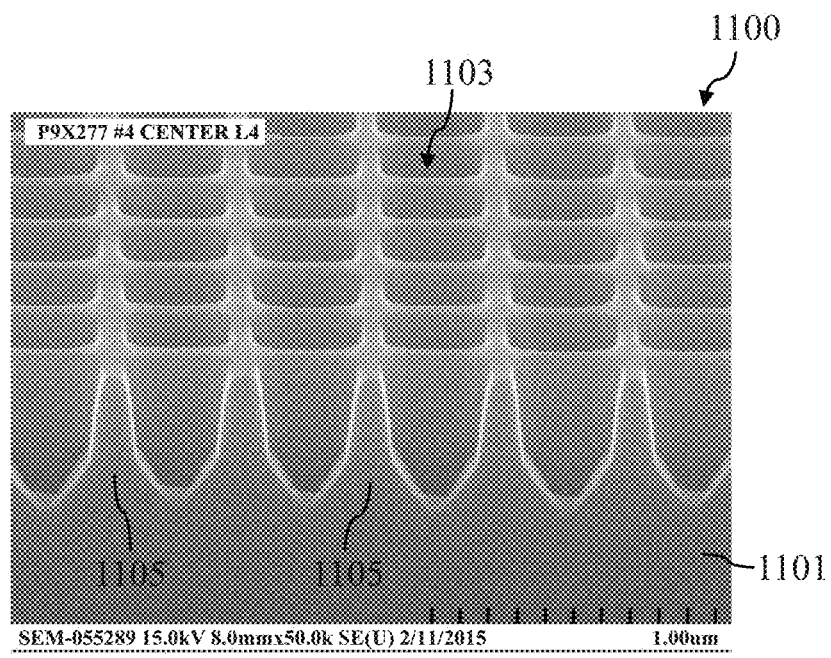
Figure 11B:
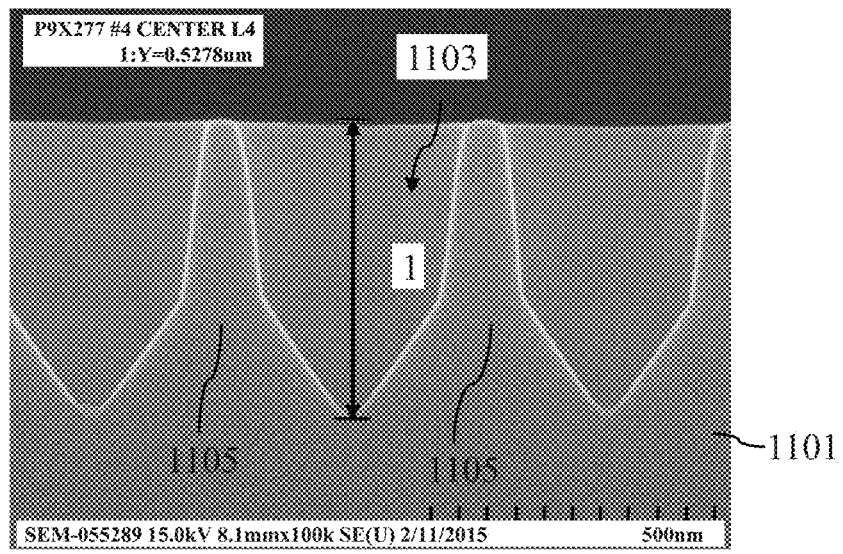

FIGS. 11A and 11B are scanning electron microscope (SEM) images illustrating a perspective and a cross-sectional views, respectively, of a HA structure 1100 formed on a back surface of a substrate 1101 in accordance with some embodiments. In the illustrated embodiment, the unremoved features 1105 of the HA structure 1100 form a continuous feature having a shape of a rectangular grid and each of the openings 1103 is surrounded by walls of the rectangular grid. The HA structure 1100 may be formed using similar methods as the HA structure 301 described above with reference to FIGS. 2 and 3 and description is not repeated herein. In the illustrated embodiment, the back surface of the substrate 1101 that is formed of silicon is patterned using a wet etch with TMAH for a duration of about 60 s to form a plurality of openings 1103. The patterned mask (not illustrated) similar to the patterned mask 203 illustrated in FIG. 2 is used to aid in patterning the substrate 1101. In the illustrated embodiments, unremoved features of the patterned mask (similar to the unremoved portions 207 of the patterned mask 203) have a width of about 0.3 µm, a spacing of about 0.15 µm, and a pitch of about 0.45 µm.

Figure 12A:
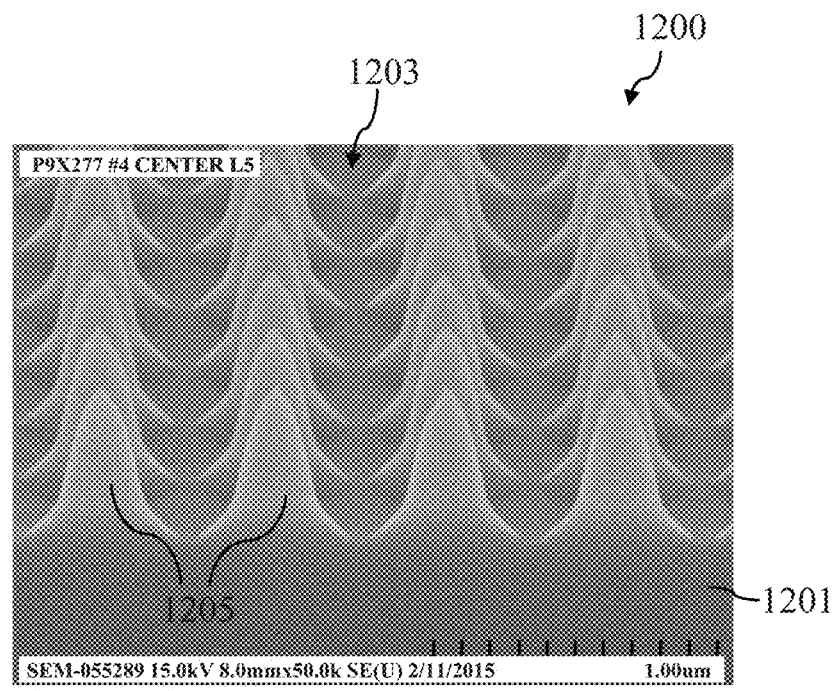
Figure 12B:
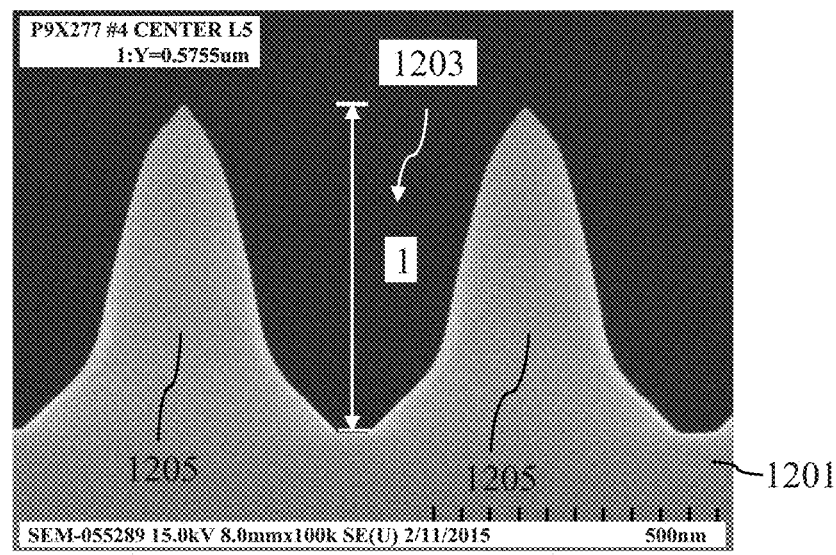

FIGS. 12A and 12B are scanning electron microscope (SEM) images illustrating a perspective and a cross-sectional views, respectively, of a HA structure 1200 formed on a back surface of a substrate 1201 in accordance with some embodiments. The HA structure 1200 may be formed using similar methods as the HA structure 301 described above with reference to FIGS. 2 and 3 and description is not repeated herein. In the illustrated embodiment, the back surface of the substrate 1201 that is formed of silicon is patterned using a wet etch with TMAH for a duration of about 60 s to form a plurality of trenches 1203. In the illustrated embodiment, the trenches 1203 have a height of about 5755 Å. The unremoved features 1205 of the HA structure 1200 that have a conical shape are arranged in a rectangular array, such that plurality of trenches 1203 form a continuous trench surrounding each of the unremoved features 1205 of the HA structure 1200. The patterned mask (not illustrated) similar to the patterned mask 203 illustrated in FIG. 2 is used to aid in patterning the substrate 1201. In the illustrated embodiments, unremoved features of the patterned mask (similar to the unremoved portions 207 of the patterned mask 203) have a width of about 0.2 µm, a spacing of about 0.4 µm, and a pitch of about 0.6 µm.

Figure 13A:
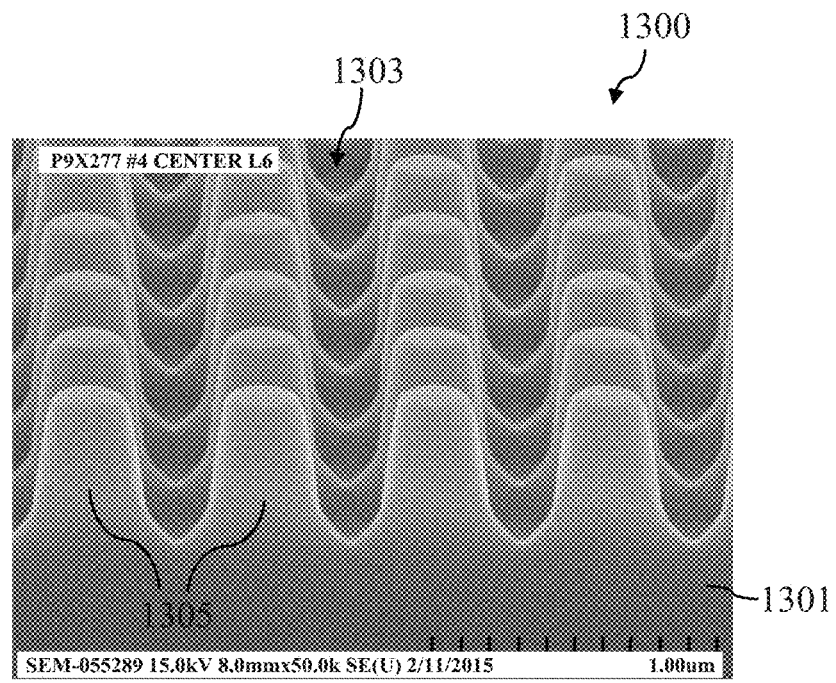
Figure 13B:
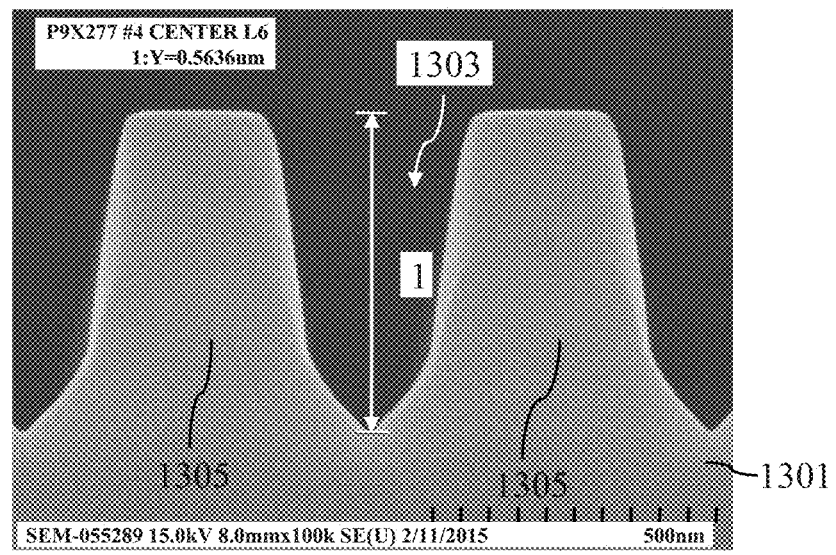

FIGS. 13A and 13B are scanning electron microscope (SEM) images illustrating a perspective and a cross-sectional views, respectively, of a HA structure 1300 formed on a back surface of a substrate 1301 in accordance with some embodiments. The HA structure 1300 may be formed using similar methods as the HA structure 301 described above with reference to FIGS. 2 and 3 and description is not repeated herein. In the illustrated embodiment, the back surface of the substrate 1301 that is formed of silicon is patterned using a wet etch with TMAH for a duration of about 60 s to form a plurality of trenches 1303. In the illustrated embodiment, the trenches 1303 have a height of about 5636 Å. The unremoved features 1305 of the HA structure 1200 that have a cylindrical shape are arranged in a rectangular array, such that plurality of trenches 1303 form a continuous trench surrounding each of the unremoved features 1305 of the HA structure 1300. The patterned mask (not illustrated) similar to the patterned mask 203 illustrated in FIG. 2 is used to aid in patterning the substrate 1301. In the illustrated embodiments, unremoved features of the patterned mask (similar to the unremoved portions 207 of the patterned mask 203) have a width of about 0.36 μm, a spacing of about 0.24 μm, and a pitch of about 0.6 μm.

Figure 14:
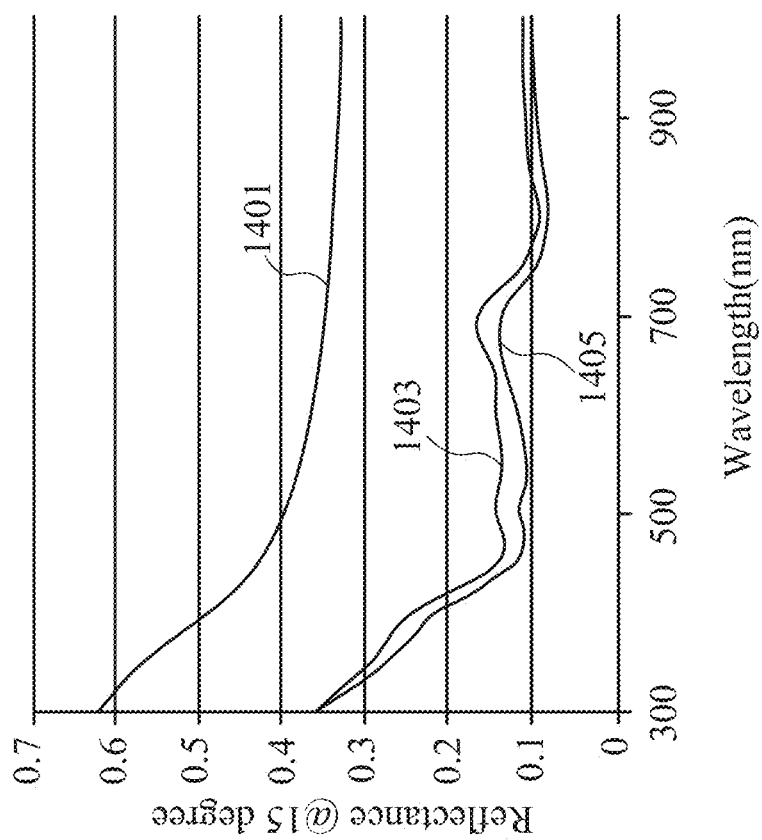
FIG. 14 illustrates reflectances of back surfaces of substrates in accordance with some embodiments.

In some embodiments, by forming an HA structure (such as, for example, the HA structures 301, 900, 1000, 1100, 1200 and 1300) on a back surface of a substrate, a reflectance of the back surface of the substrate may be reduced compared to an unpatterned portion of the back surface of the substrate. FIG. 14 depicts various curves illustrating the dependence of the reflectance on a wavelength of incident light that forms an angle of about 15 degrees with a normal to the back surface of the substrate. The curve 1401 is a reflectance of a back surface of an unpatented substrate. The curves 1403 and 1405 are reflectances of back surfaces of substrates having HA structures. As show in FIG. 14, the HA structures may significantly reduce the reflectance of the back surface of the substrate. In some embodiments, the reflectance of the back surface of the substrate may be reduced by about 30% or greater by forming an HA structure on the back surface of the substrate. Furthermore, the reflectance of light is reduced not only in the visible region but also in the near infrared (NIR) region, which advantageously allows for application of the HA patterns in NIR devices.

Figure 15:
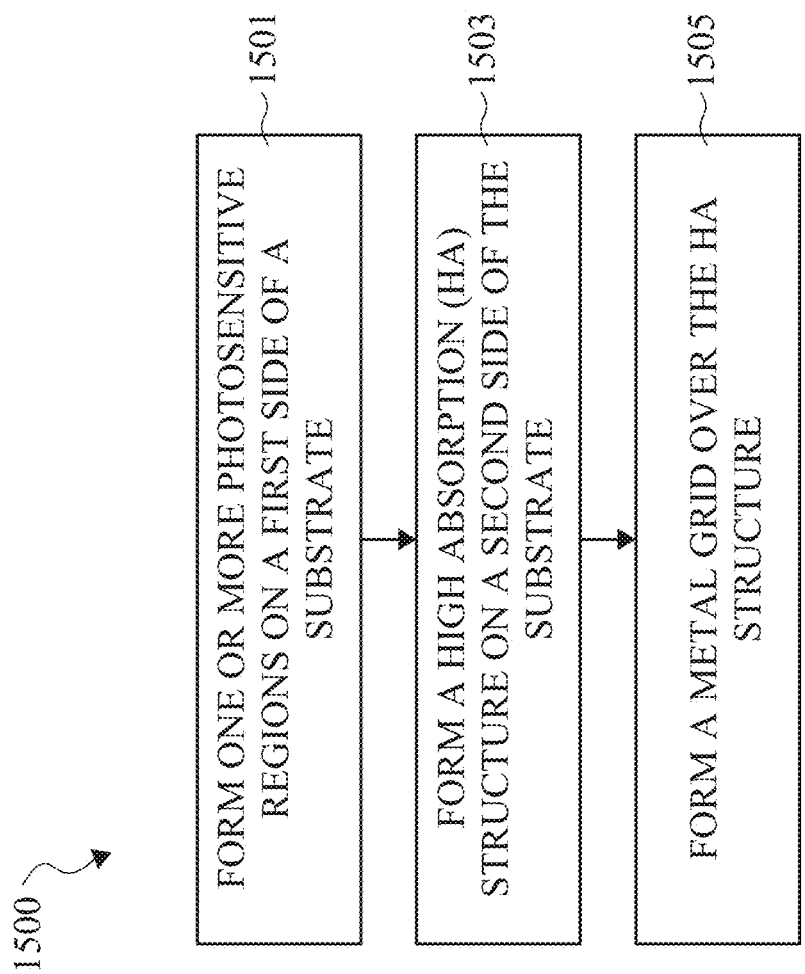
FIG. 15 is a flow diagram illustrating a method of forming a BSI image sensor in accordance with some embodiments.

FIG. 15 is a flow diagram illustrating a method 1500 of forming a BSI image sensor in accordance with some embodiments. The method starts with step 1501, where one or more photosensitive regions (such as the photosensitive pixel 109 illustrated in FIG. 1) are formed on a first side of a substrate (such as the front surface 107A of the substrate 107 illustrated in FIG. 1) as described above with reference to FIG. 1. In step 1503, a high absorption (HA) structure (such as the HA structure 301 illustrated in FIG. 3) is formed on a second side of the substrate (such as the back surface 107B of the substrate 107 illustrated in FIG. 1) that is opposite the first side of the substrate as described above with reference to FIGS. 2 and 3. In step 1505, a metal grid (such as the metal grid 703 illustrated in FIG. 7) is formed over the HA structure as described above with reference to FIGS. 4-7.

Figure 16:
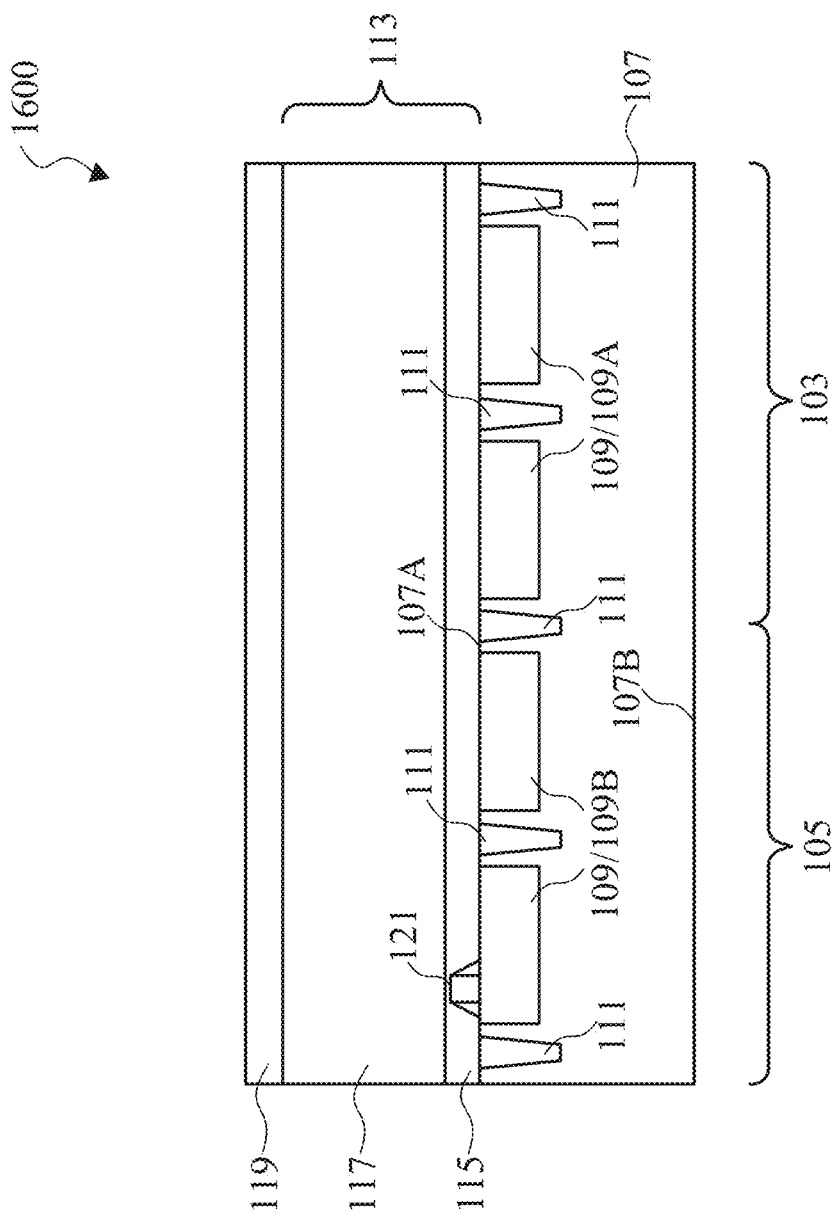
FIGS. 16-19 are cross-sectional views of various processing steps during fabrication of a BSI image sensor in accordance with some embodiments.

FIGS. 16-19 are cross-sectional views of various processing steps during fabrication of a BSI image sensor 1600 in accordance with some embodiments. FIG. 16 illustrates an intermediate structure of the BSI image sensor 1600 in accordance with some embodiments. In some embodiments, the intermediate structure of the BSI image sensor 1600 is similar to the intermediate structure of the BSI image sensor 100 described above with reference to FIG. 1, with like elements labeled by like reference numbers, and the description is not repeated herein.

Figure 17:
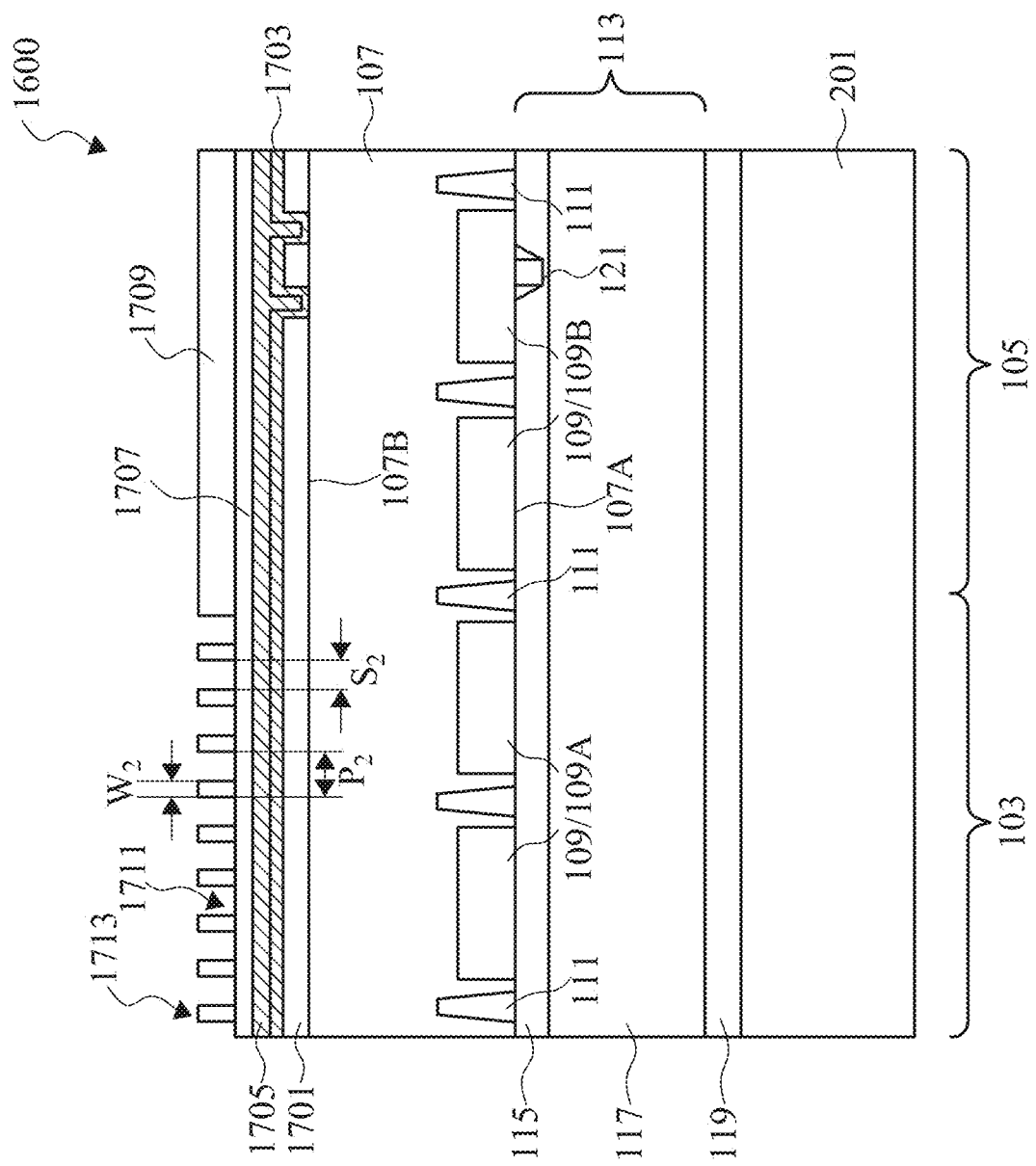

Referring FIG. 17, the BSI image sensor 1600 is flipped and bonded to a carrier substrate 201 such that the front surface 107A of the substrate 107 faces the carrier substrate 201 and the back surface 107B of the substrate 107 is exposed for further processing. In some embodiments, the BSI image sensor 1600 is bonded to the carrier substrate 201 using similar methods as described above with reference to FIG. 2 and the description is not repeated herein. After the BSI image sensor 1600 and the carrier substrate 201 are bonded, a thinning process may be applied to the back surface 107B of the BSI image sensor 1600. In some embodiments, the back surface 107B of the BSI image sensor 1600 may be thinned using similar methods as described above with reference to FIG. 2 and the description is not repeated herein.

After thinning, a first dielectric layer 1701 is formed on the back surface 107B of the substrate 107. In some embodiments, the first dielectric layer 1701 may be formed using similar materials and methods as the first dielectric layer 501 described above with reference to FIG. 5 and the description is not repeated herein. In some embodiments, a thickness of the first dielectric layer 1701 may be between about 50 Å and about 250 Å, such as about 100 Å. In some embodiments, the thickness of the first dielectric layer 1701 may be less than the thickness of the first dielectric layer 501, which may advantageously allow reduction of the optical path of the BSI image sensor 1600 compare to the BSI image sensor 100. The first dielectric layer 1701 may also referred to as a first buffer oxide layer 1701. Accordingly, the quantum efficiency of the BSI image sensor 1600 may be advantageously increased and the optical cross-talk of the BSI image sensor 1600 may be advantageously reduced.

Subsequently, a barrier/adhesion layer 1703 is formed over the first dielectric layer 1701 and a conductive layer 1705 is formed over the barrier/adhesion layer 1703. In some embodiments, the barrier/adhesion layer 1703 and the conductive layer 1705 may be formed using similar materials and methods as the barrier/adhesion layer 601 and the conductive layer 603, respectively, described above with reference to FIG. 6 and the description is not repeated herein. In some embodiments, a thickness of the barrier/adhesion layer 1703 may be between about 100 Å and about 500 Å, and a thickness of the conductive layer 1705 may be between about 500 Å and about 3000 Å. In the illustrated embodiment, the barrier/adhesion layer 1703 comprises titanium nitride having a thickness of about 300 Å and the conductive layer 1705 comprises tungsten having a thickness of about 2000 Å. It is appreciated that the dimensions recited throughout the description are merely examples, and may be changed to different values. As described below in greater detail, the barrier/adhesion layer 1703 and the conductive layer 1705 are patterned to form a metal shield 1801 and a metal grid 1803 (see FIG. 18).

In some embodiments, a second dielectric layer 1707 is formed over the conductive layer 1705. In some embodiments, the second dielectric layer 1707 may be formed using similar materials and methods as the first dielectric layer 501 described above with reference to FIG. 5 and the description is not repeated herein. In some embodiments, the first dielectric layer 1701 and the second dielectric layer 1707 may be formed of a same material. In other embodiments, the first dielectric layer 1701 and the second dielectric layer 1707 may be formed of different materials. Subsequently, the second dielectric layer 1707 is planarized using a grinding process, a CMP process, an etching process, or the like. After the planarization process, the second dielectric layer 1707 may have a thickness between about 500 Å and about 2000 Å. The second dielectric layer 1707 may be also referred to as a second buffer oxide layer 1707.

Referring further to FIG. 17, a patterned mask 1709 is formed over the second dielectric layer 1707. In some embodiments, the patterned mask 1709 may be formed using similar materials and methods as the patterned mask 203 described above with reference to FIG. 2 and the description is not repeated herein. In some embodiments, the patterned mask 1709 comprises a plurality of opening 1711 exposing portions of the second dielectric layer 1707 in the pixel array region 103, while the second dielectric layer 1707 in the BLC region is completely covered by the patterned mask 1709. In some embodiments, unremoved portions 1713 of the patterned mask 1709 have a uniform width $W_2$, uniform spacing $S_2$, and a uniform pitch $P_2$, with $P_2$ being equal to a sum of $W_2$ and $S_2$. In some embodiments, the unremoved portions 1713 of the patterned mask 1709 may form a two-dimensional rectangular array as viewed from top. As described below in greater detail, the patterned mask 1709 is used as an etch mask while patterning the first dielectric layer 1701, the barrier/adhesion layer 1703, the conductive layer 1705, and the second dielectric layer 1707. In some embodiments, the width $W_2$ is between about 0.08 µm and about 0.3 µm, the spacing $S_2$ is between about 0.72 µm and about 2.7 µm, and the pitch $P_2$ is between about 0.8 µm and about 3 µm.

Figure 18:
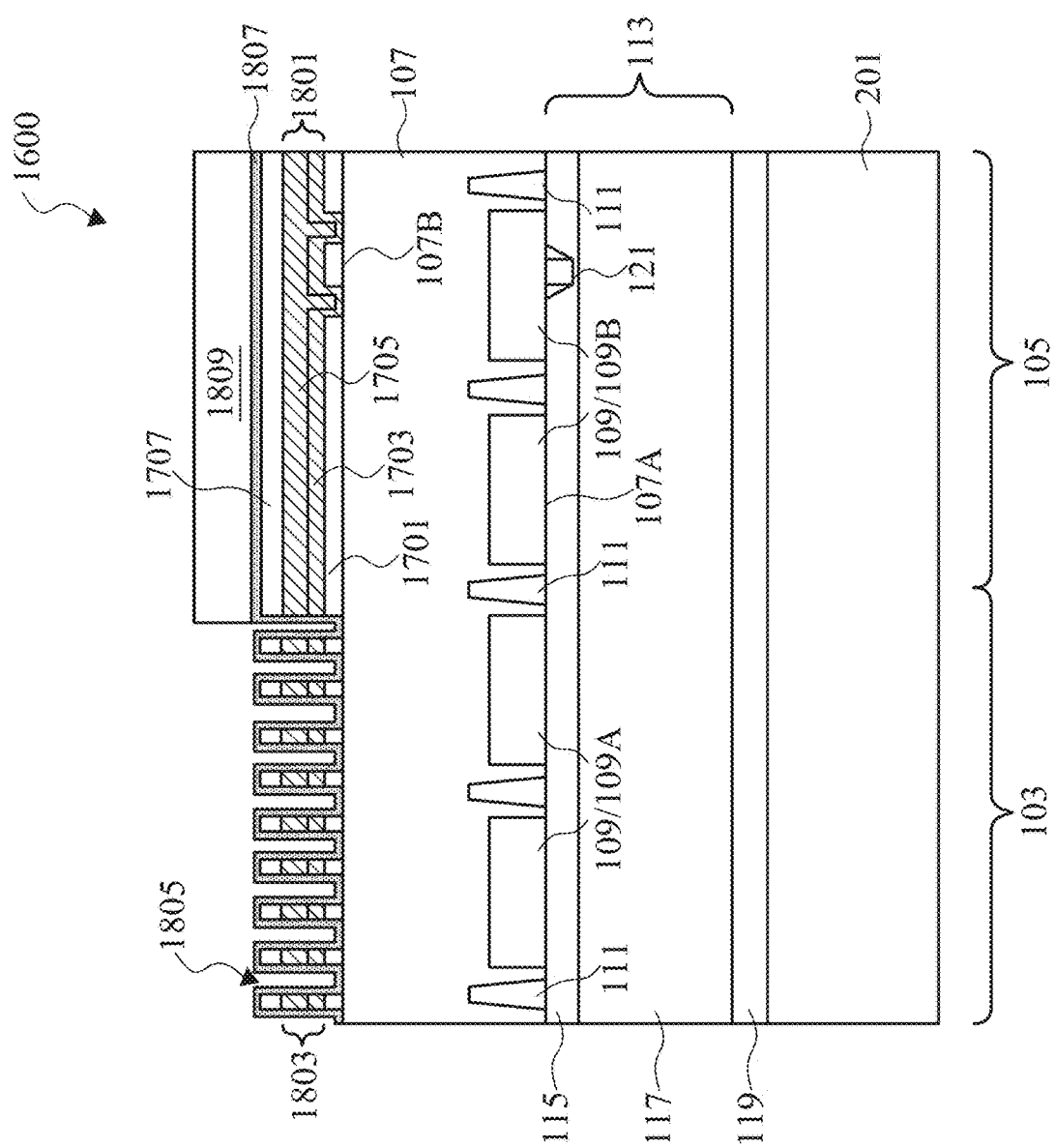

Referring to the FIG. 18, the first dielectric layer 1701, the barrier/adhesion layer 1703, the conductive layer 1705, and the second dielectric layer 1707 are patterned to form a plurality of openings 1805. The openings 1805 extend through the first dielectric layer 1701, the barrier/adhesion layer 1703, the conductive layer 1705 and the second dielectric layer 1707, and expose portions of the back surface 107B of the substrate 107 in the pixel array region 103. In some embodiments, the first dielectric layer 1701, the barrier/adhesion layer 1703, the conductive layer 1705 and the second dielectric layer 1707 may be patterned using one or multiple suitable etching processes, while using the patterned mask 1709 as an etch mask. After patterning, the patterned mask 1709 is removed. In some embodiments, the patterned mask 1709 may be removed using similar methods as the patterned mask 203 described above with reference to FIG. 3 and the description is not repeated herein.

Referring further to FIG. 18, the patterning process forms the metal shield 1801 and the metal grid 1803. In the illustrated embodiments, walls of the metal grid 1803 may have a width, a spacing, a pitch similar to the width $W_2$, the spacing $S_2$, and the pitch $P_2$, respectively, of the unremoved portions 1713 of the patterned mask 1709. As described in greater detail below, the metal grid 1803, with respective unremoved portions of the first dielectric layer 1701 and the second dielectric layer 1707, is used a mask to aid in patterning the back surface 107B of the substrate 107 to form an HA structure 1901 (see FIG. 19). In some embodiments, a third dielectric layer 1807 is formed over the metal grid 1803 and the metal shield 1801 to protect the metal grid 1803 from patterning process while forming the HA structure 1901. In some embodiments, the third dielectric layer 1807 may be formed using similar materials and methods as the first dielectric layer 501 described above with reference to FIG. 5 and the description is not repeated herein. In some embodiments, the first dielectric layer 1701, the second dielectric layer 1707 and the third dielectric layer 1807 may be formed of a same material. In other embodiments, the first dielectric layer 1701, the second dielectric layer 1707 and the third dielectric layer 1807 may be formed of different materials.

In some embodiments, a patterned mask 1809 is formed over the third dielectric layer 1807. In the illustrated embodiment, the patterned mask 1809 protects the metal shield 1801 in the BLC region 105 of the BSI image sensor 1600, while the metal grid 1803 in the pixel array region 103 of the BSI image sensor 1600 is exposed. In some embodiments, the patterned mask 1809 may be formed using similar materials and methods as the patterned mask 203 described above with reference to FIG. 2 and the description is not repeated herein. As described below in greater detail, the metal grid 1803 and the patterned mask 1809 is used a combined mask to aid in patterning the back surface 107B of the substrate 107.

Figure 19:
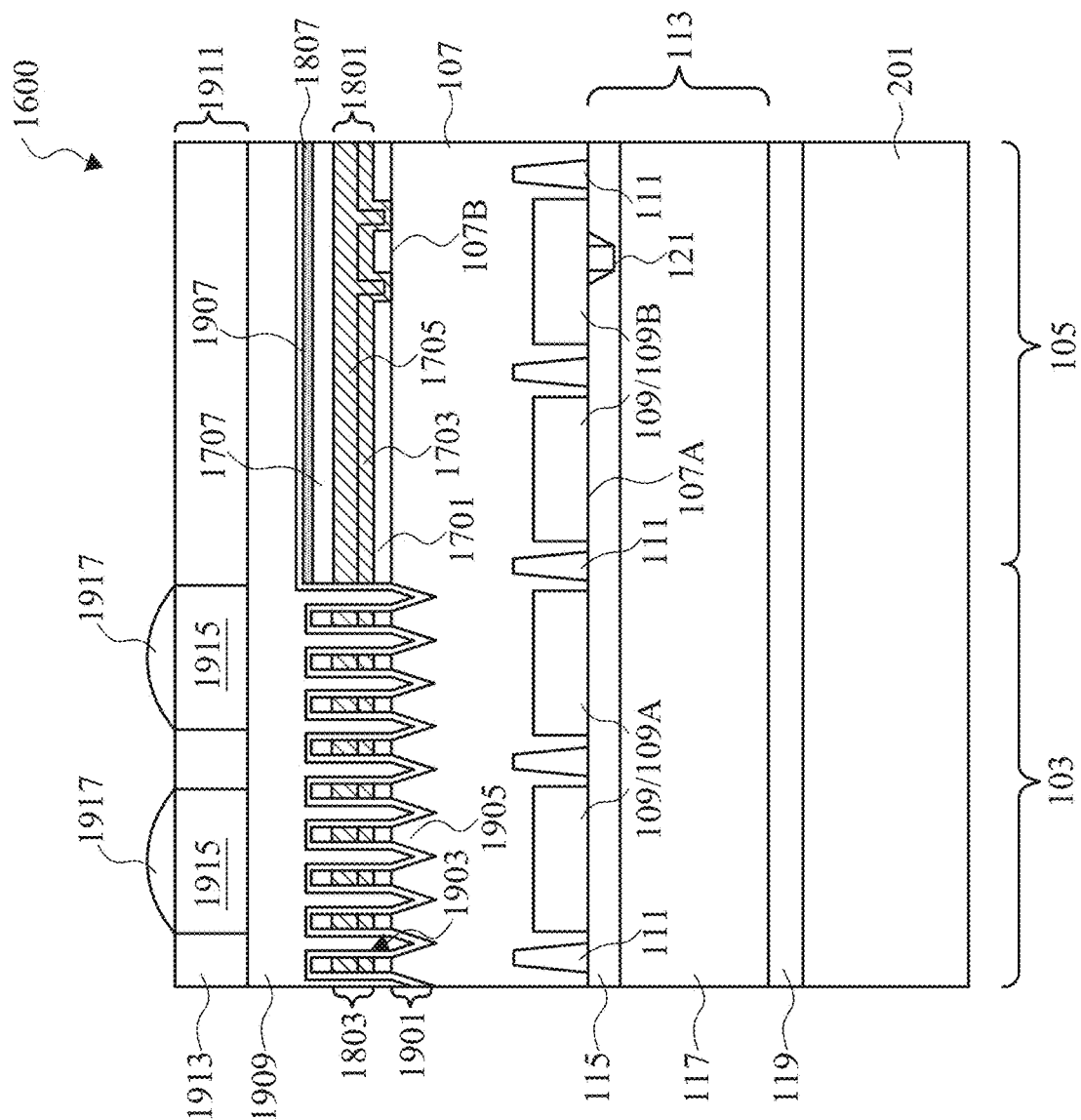

Referring to FIG. 19, the back surface 107B of the substrate 107 in the pixel array region 103 is patterned to form the HA structure 1901. In some embodiments, the back surface 107B of the substrate 107 is patterned using a suitable etching process while using the metal grid 1803 and the patterned mask layer 1809 as a combined etch mask. In some embodiments, the HA structure 1901 may be formed using similar etching processes as the HA structure 301 described above with reference to FIG. 3 and the description is not repeated herein. In the illustrated embodiment, the HA structure 1901 comprises a plurality of trenches 1903 and a plurality of unremoved features 1905 that are interposed between neighboring trenches 1903. In some embodiments, the HA structure 1901 may have a pattern as described above with reference to FIGS. 9A-13B and the description is not repeated herein. In some embodiments, the patterning process that forms the HA structure 1901 may also remove a first portion of the third dielectric layer 1807 in the pixel array region 103, while a second portion of the third dielectric layer 1807 in the BLC region 105 remains unremoved. Subsequently, the patterned mask 1809 is removed using similar methods as the patterned mask 203 described above with reference to FIG. 2 and the description is not repeated herein.

Referring further to FIG. 19, after forming the HA structure 1901, a BARC layer 1907 is formed on sidewalls of the trenches 1903 and over the metal grid 1803 and the metal shield 1801. In some embodiments, the BARC layer 1907 may be formed using similar materials and methods as the BARC layer 401 described above with reference to FIG. 4 and the description is not repeated herein. In the illustrated embodiment, the third dielectric layer 1807 is removed in the pixel array region 103 and at least a portion of the BARC layer 1907 contacts the sidewalls of the trenches 1903 and sidewalls of the metal grid 1803.

In some embodiments, a fourth dielectric layer 1909 is formed over the BARC layer 1907. In some embodiments, the fourth dielectric layer 1909 may be formed using similar materials and methods as the first dielectric layer 501 described above with reference to FIG. 5 and the description is not repeated herein. In some embodiments, the first dielectric layer 1701, the second dielectric layer 1707, the third dielectric layer 1807, and the fourth dielectric layer 1909 may be formed of a same material. In other embodiments, the first dielectric layer 1701, the second dielectric layer 1707, the third dielectric layer 1807, and the fourth dielectric layer 1909 may be formed of different materials. Subsequently, the fourth dielectric layer 1909 is planarized using a grinding process, a CMP process, an etching process, or the like. After the planarization process, the fourth dielectric layer 1909 may have a thickness between about 500 Å and about 3000 Å, such as about 1500 Å. The fourth dielectric layer 1909 may be also referred to as a fourth buffer oxide layer 1909.

Referring further to FIG. 19, a color filter layer 1911 is formed over the fourth dielectric layer 1909. In some embodiments, the color filter layer 1911 comprises a fifth dielectric layer 1913 with a plurality of color filters 1915 formed therein. In some embodiments, the fifth dielectric layer 1913 and the color filters 1915 may formed using similar materials and methods as the third dielectric layer 805 and the color filters 807, respectively, described above with reference to FIG. 8 and the description is not repeated herein. Subsequently, microlenses 1917 are formed over the color filter layer 1911, such that the microlenses 1917 are aligned with respective color filters 1915 and respective active photosensitive pixels 109A. In some embodiments, the microlenses 1917 may be formed using similar materials and methods as the microlenses 809 described above with reference to FIG. 8 and the description is not repeated herein. In some embodiments, after forming the microlenses 1917, the carrier substrate 201 may be de-bonded form the BSI image sensor 1600 and the BSI image sensor 1600 may undergo further processing such as, for example, packaging.

Figure 20:
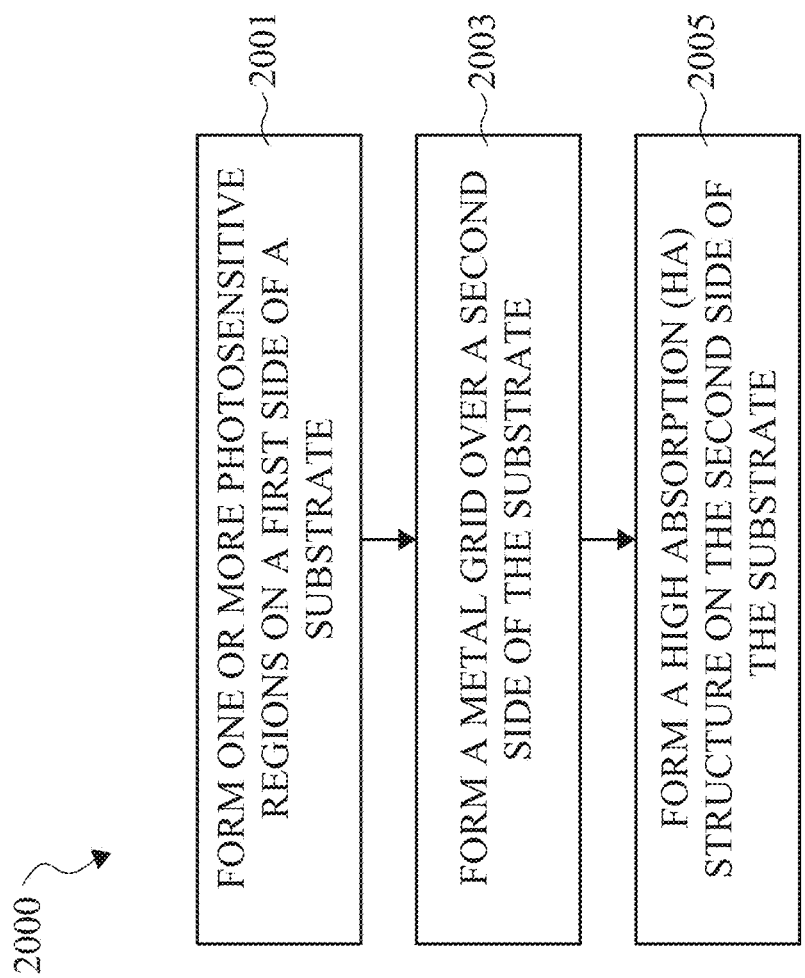
FIG. 20 is a flow diagram illustrating a method of forming a BSI image sensor in accordance with some embodiments.

FIG. 20 is a flow diagram illustrating a method 2000 of forming a BSI image sensor in accordance with some embodiments. The method 2000 starts with step 2001, where one or more photosensitive regions (such as the photosensitive pixel 109 illustrated in FIG. 16) are formed on a first side of a substrate (such as the front surface 107A of the substrate 107 illustrated in FIG. 16) as described above with reference to FIG. 16. In step 2003, a metal grid (such as the metal grid 1803 illustrated in FIG. 18) is formed over a second side of the substrate (such as the back surface 107B of the substrate 107 illustrated in FIG. 16) that is opposite the first side of the substrate as described above with reference to FIGS. 17 and 18. In step 2003, after forming the metal grid, a high absorption (HA) structure (such as the HA structure 1901 illustrated in FIG. 19) is formed on the second side of the substrate as described above with reference to FIG. 19.

Various embodiments presented herein may provide several advantages. Embodiments such as described herein allow for forming a BSI image sensor having a high absorption (HA) structure on a backside. By forming the HA structure on a backside of a BSI image sensor, light reflectance from the back side may be improved. Accordingly, performance of the BSI image sensor may be advantageously improved in visible and near infrared regimes. Furthermore, various embodiments described herein reduce the optical path of a BSI image sensor, which advantageous improves the quantum efficiency and reduces the optical cross-talk of the BSI image sensor.

According to an embodiment, a method includes forming a plurality of photosensitive pixels in a substrate, the substrate having a first surface and a second surface, the second surface being opposite the first surface, the substrate having one or more active devices on the first surface. A first portion of the second surface is protected. A second portion of the second surface is patterned to form recesses in the substrate. An anti-reflective layer is formed on sidewalls of the recesses. A metal grid is formed over the second portion of the second surface, the anti-reflective layer being interposed between the substrate and the metal grid.

According to another embodiment, a method includes forming a plurality of photosensitive regions in a substrate, the substrate having a first surface and a second surface, the second surface being opposite the first surface, the substrate having at least one active device on the first surface. A metal grid is formed over a first portion of the second surface, the metal grid exposing portions of the substrate. Exposed portions of the substrate are recessed to form recesses in the substrate. An anti-reflective layer is formed on sidewalls of the recesses and sidewalls of the metal grid. The recesses are filled with a first dielectric layer, the first dielectric layer extending above a topmost surface of the metal grid.

According to yet another embodiment, a device includes a substrate, the substrate having a first surface and a second surface, the first surface being opposite to the second surface, at least one active device on the first surface of the substrate, and a plurality of photosensitive regions in the substrate. The device further includes a plurality of recesses in the second surface of the substrate, the plurality of recesses being disposed over the plurality of photosensitive regions, an anti-reflective layer extending along sidewalls of the plurality of recesses, and a metal grid over the plurality of recesses.

According to yet another embodiment, a method includes forming a plurality of photosensitive devices in a substrate, the substrate having a pixel array region and a black level correction (BLC) region adjacent the pixel array region. An interconnect structure is formed on a first side of the substrate. A second side of the substrate is patterned in the pixel array region to form recesses in the substrate, the second side being opposite the first side. An anti-reflective layer is blanket deposited over the recesses in the pixel array region and over the second side of the substrate in the BLC region. A first dielectric layer is formed over the anti-reflective layer, the first dielectric layer overfilling the recesses. A metal layer is formed over the first dielectric layer. The metal layer is patterned to form a metal grid over the pixel array region and a metal shield over the BLC region.

According to yet another embodiment, a device includes a substrate having a pixel array region and a black level correction (BLC) region adjacent the pixel array region, a plurality of photosensitive regions in the substrate, and a plurality of protrusions on a first side of the substrate in the pixel array region. The plurality of protrusions are spaced apart from the plurality of photosensitive regions. The device further includes an anti-reflective layer over the first side of the substrate, the anti-reflective layer extending along sidewalls of the plurality of protrusions, and a metal grid over the pixel array region of the substrate, the plurality of protrusions being interposed between the metal grid and the plurality of photosensitive regions.

According to yet another embodiment, a device includes a substrate having a pixel array region and a black level correction (BLC) region adjacent the pixel array region, an interconnect structure over the pixel array region and the black level correction (BLC) region of the substrate, a plurality of photosensitive regions in the pixel array region and the BLC region of the substrate, and a plurality of protrusions on a first side of the substrate in the pixel array region. The plurality of photosensitive regions are interposed between the plurality of protrusions and the interconnect structure. The device further includes an anti-reflective layer extending along sidewalls of the plurality of protrusions, a metal grid over the plurality of protrusions, and a metal shield over the first side of the substrate in the BLC region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
 a substrate, the substrate having a first surface and a second surface, the first surface being opposite to the second surface;
 at least one active device on the first surface of the substrate;
 a plurality of photosensitive regions in the substrate;
 a plurality of recesses in the second surface of the substrate, the plurality of recesses being disposed over the plurality of photosensitive regions;

an anti-reflective layer extending along sidewalls of the plurality of recesses;

a metal grid over the plurality of recesses; and a metal shield adjacent the metal grid, wherein the anti-reflective layer extends along a sidewall of the metal shield and sidewalls of the metal grid.

2. The device of claim 1, wherein the metal shield is substantially level with the metal grid.

3. The device of claim 1, wherein a portion of the metal shield extends through the anti-reflective layer and physically contacts the second surface of the substrate.

4. The device of claim 1, wherein portions of the substrate interposed between neighboring recesses are arranged in a rectangular array as viewed from top.

5. The device of claim 1, wherein portions of the substrate interposed between neighboring recesses form a rectangular grid as viewed from top.

6. A device comprising:
a substrate having a pixel array region and a black level correction (BLC) region adjacent to the pixel array region;
a plurality of photosensitive regions in the substrate;
a plurality of protrusions on a first side of the substrate in the pixel array region, the plurality of protrusions being spaced apart from the plurality of photosensitive regions;
an anti-reflective layer over the first side of the substrate, the anti-reflective layer extending along sidewalls of the plurality of protrusions;
a metal grid over the pixel array region of the substrate, the plurality of protrusions being interposed between the metal grid and the plurality of photosensitive regions; and
a metal shield over the BLC region of the substrate, wherein the anti-reflective layer is interposed between the metal shield and the first side of the substrate.

7. The device of claim 6, wherein a topmost surface of the metal shield is level with a topmost surface of the metal grid.

8. The device of claim 6, wherein a portion of the metal shield extends through the anti-reflective layer and physically contacts the first side of the substrate in the BLC region.

9. The device of claim 6, wherein the plurality of protrusions are arranged in a rectangular array.

10. A device comprising:
a substrate having a pixel array region and a black level correction (BLC) region adjacent to the pixel array region;
an interconnect structure over the pixel array region and the BLC region of the substrate;
a plurality of photosensitive regions in the pixel array region and the BLC region of the substrate;
a plurality of protrusions on a first side of the substrate in the pixel array region, the plurality of photosensitive regions being interposed between the plurality of protrusions and the interconnect structure;
an anti-reflective layer extending along sidewalls of the plurality of protrusions;
a metal grid over the plurality of protrusions; and
a metal shield over the first side of the substrate in the BLC region, wherein the anti-reflective layer is interposed between the metal shield and the first side of the substrate.

11. The device of claim 10, wherein the plurality of protrusions form a saw-tooth pattern in a cross-section view.

12. The device of claim 10, wherein the plurality of protrusions have a uniform width and a uniform pitch.

13. The device of claim 10, wherein a topmost surface of the metal grid is level with a topmost surface of the metal shield.

14. The device of claim 10, wherein a portion of the metal shield is in physical contact with the first side of the substrate in the BLC region.

15. The device of claim 10, wherein the metal grid and the metal shield comprise a same conductive material.

16. The device of claim 1, wherein the anti-reflective layer comprises an oxide material.

17. The device of claim 6, wherein the metal shield comprises:
a barrier layer comprising a first conductive material; and
a conductive layer over the barrier layer, the conductive layer comprising a second conductive material different from the first conductive material.

* * * * *